(12) United States Patent
Hayashi et al.

(10) Patent No.: US 11,218,344 B2
(45) Date of Patent: Jan. 4, 2022

(54) TRANSMISSION DEVICE, TRANSMISSION METHOD, AND COMMUNICATION SYSTEM

(71) Applicant: Sony Corporation, Tokyo (JP)

(72) Inventors: Hiroaki Hayashi, Kanagawa (JP);
Hideyuki Suzuki, Kanagawa (JP);
Takahiro Shimada, Tokyo (JP);
Masatsugu Sugano, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/890,262

(22) Filed: Jun. 2, 2020

(65) Prior Publication Data

US 2020/0304346 A1    Sep. 24, 2020

Related U.S. Application Data

(63) Continuation of application No. 16/074,260, filed as application No. PCT/JP2017/001545 on Jan. 18, 2017, now Pat. No. 10,693,685.

(30) Foreign Application Priority Data

Feb. 22, 2016 (JP) .............................. JP2016-031222

(51) Int. Cl.
*H04L 25/02* (2006.01)
*H04B 3/18* (2006.01)
*H04L 25/03* (2006.01)

(52) U.S. Cl.
CPC .......... *H04L 25/0278* (2013.01); *H04B 3/18* (2013.01); *H04L 25/0212* (2013.01); *H04L 25/03878* (2013.01)

(58) Field of Classification Search
CPC ............. H04L 25/0212; H04L 25/0278; H04L 25/028; H04B 3/06; H04B 10/50; H04B 10/60
See application file for complete search history.

(56) References Cited

U.S. PATENT DOCUMENTS

| 6,674,313 B2* | 1/2004 | Kurisu | .......... H03K 19/018585 327/108 |
| 8,064,535 B2 | 11/2011 | Wiley | |

(Continued)

FOREIGN PATENT DOCUMENTS

| CN | 1574672 A | 2/2005 |
| CN | 104423406 A | 3/2015 |

(Continued)

OTHER PUBLICATIONS

Extended European Search Report dated Dec. 14, 2018 for corresponding European Application No. 17756027.3**.

(Continued)

*Primary Examiner* — Jason Crawford
(74) *Attorney, Agent, or Firm* — Michael Best & Friedrich LLP

(57) ABSTRACT

A transmission device according to the disclosure includes a driver section that is able to transmit a data signal by using three or more predetermined number of voltage states and set voltages in each of the voltage states; and a control section that sets an emphasis voltage that is based on a transition among the predetermined number of the voltage states, and thereby causes the driver section to perform emphasis.

20 Claims, 28 Drawing Sheets

(56) References Cited

U.S. PATENT DOCUMENTS

| | | | |
|---|---|---|---|
| 9,148,198 B1* | 9/2015 | Zhang | H04B 3/04 |
| 9,473,291 B2* | 10/2016 | Kil | H04L 7/0041 |
| 2007/0273425 A1 | 11/2007 | Greeff | |
| 2012/0049897 A1 | 3/2012 | Kubo | |
| 2014/0112401 A1* | 4/2014 | Wiley | H04L 25/0272 |
| | | | 375/259 |
| 2014/0153665 A1* | 6/2014 | Wiley | H04L 25/4917 |
| | | | 375/288 |
| 2016/0204964 A1* | 7/2016 | Takahashi | H04L 25/03343 |
| | | | 375/230 |
| 2016/0204965 A1 | 7/2016 | Desclos et al. | |
| 2016/0305806 A1 | 10/2016 | Feller | |
| 2017/0007095 A1 | 1/2017 | Kutsuma et al. | |
| 2017/0026204 A1* | 1/2017 | Takahashi | H02J 50/12 |
| 2017/0060803 A1* | 3/2017 | Shim | H04L 25/4917 |
| 2019/0007095 A1* | 1/2019 | Hayashi | H04L 25/026 |
| 2019/0123724 A1* | 4/2019 | Hayashi | H04B 1/04 |
| 2019/0165786 A1* | 5/2019 | Shimada | H03K 19/0185 |
| 2019/0305806 A1* | 10/2019 | Hayashi | H04B 1/04 |

FOREIGN PATENT DOCUMENTS

| | | |
|---|---|---|
| CN | 104426365 A | 3/2015 |
| CN | 104678311 A | 6/2015 |
| JP | 06-261092 A | 9/1994 |
| JP | 2011-142382 A | 7/2011 |
| JP | 2015-228554 A | 12/2015 |
| WO | 2015/021257 A1 | 2/2015 |
| WO | 2015/146511 A1 | 10/2015 |
| WO | 2015/182047 A1 | 12/2015 |

OTHER PUBLICATIONS

MA Chunming, Xie Da, YU Zhiwen, ZHANG Yanchi, E, "Voltage control strategy of SVG", Electric Power Automation Equipment, vol. 33, No. 3, Mar. 2013. English abstract on p. 107 provided as CER.

* cited by examiner

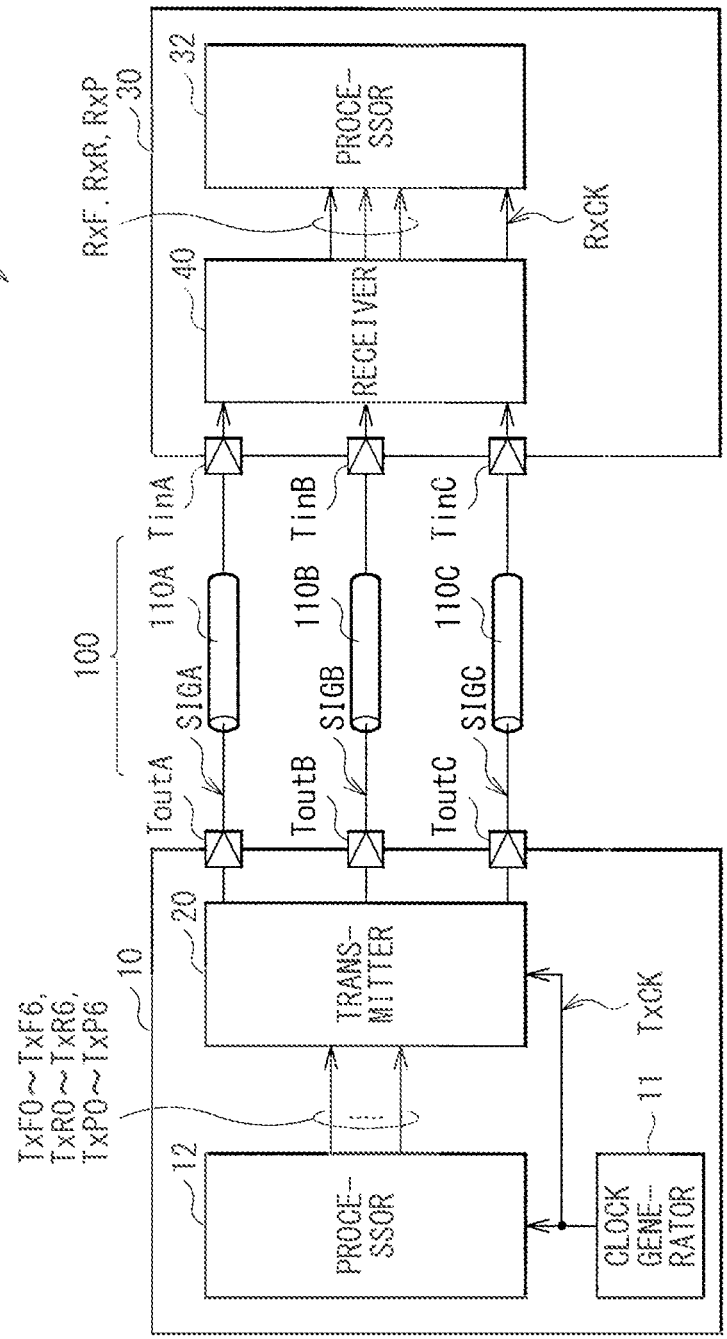

[FIG. 2]
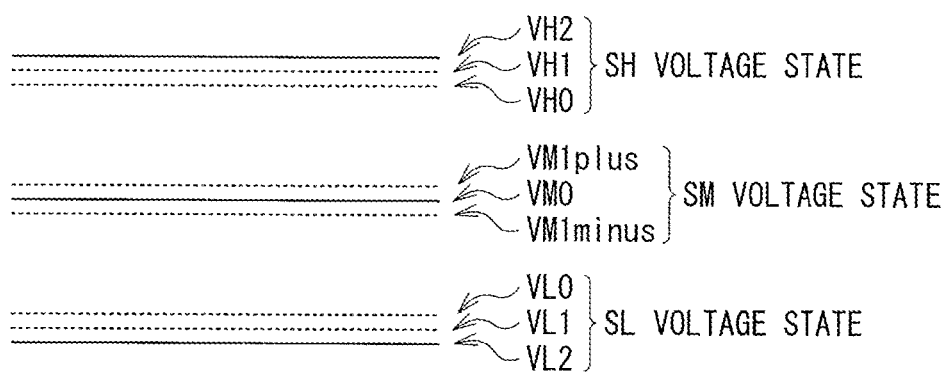
[FIG. 3]
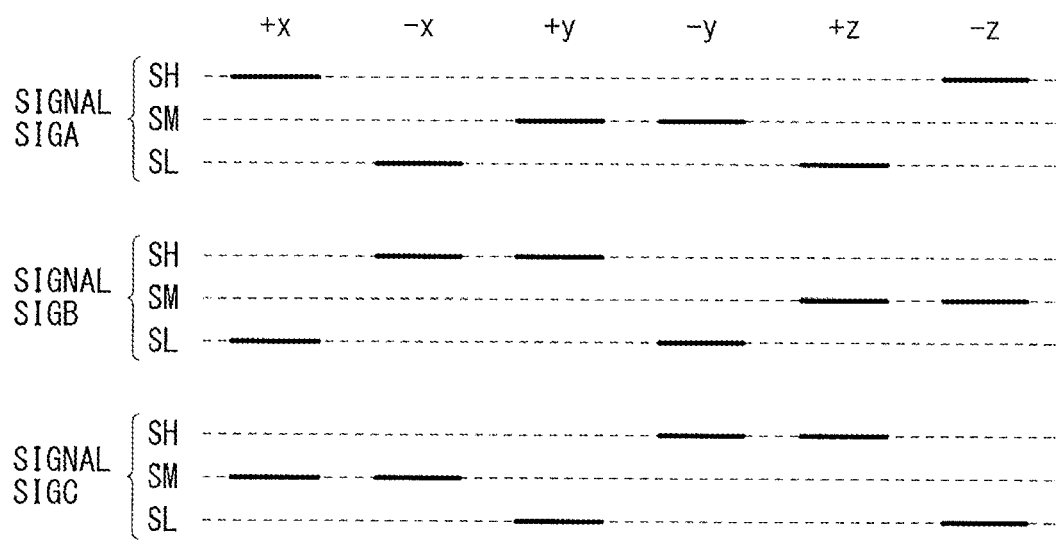

[ FIG. 4 ]
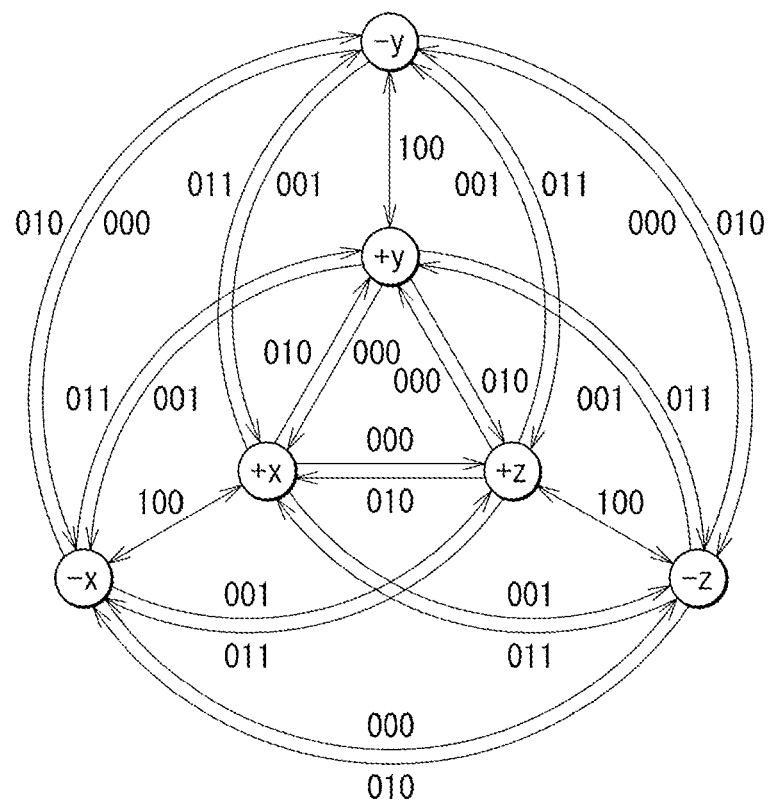

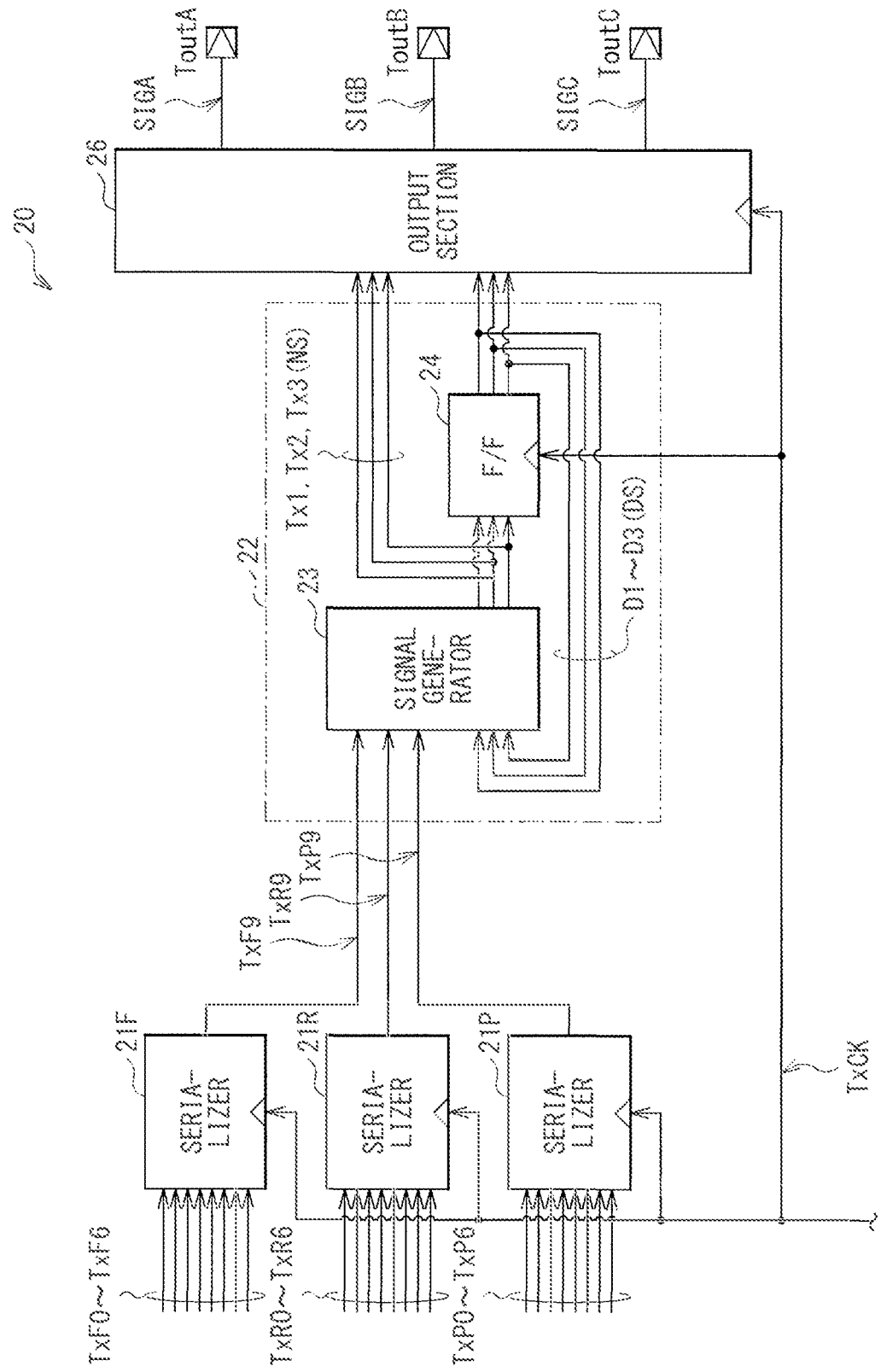

[ FIG. 6 ]

| TxF9, TxR9, TxP9 | DS=+x | DS=-x | DS=+y | DS=-y | DS=+z | DS=-z |
|---|---|---|---|---|---|---|
| 000 | +z | -z | +x | -x | +y | -y |
| 001 | -z | +z | -x | +x | -y | +y |
| 010 | +y | -y | +z | -z | +x | -x |
| 011 | -y | +y | -z | +z | -x | +x |
| 1xx | -x | +x | -y | +y | -z | +z |

[ FIG. 7 ]
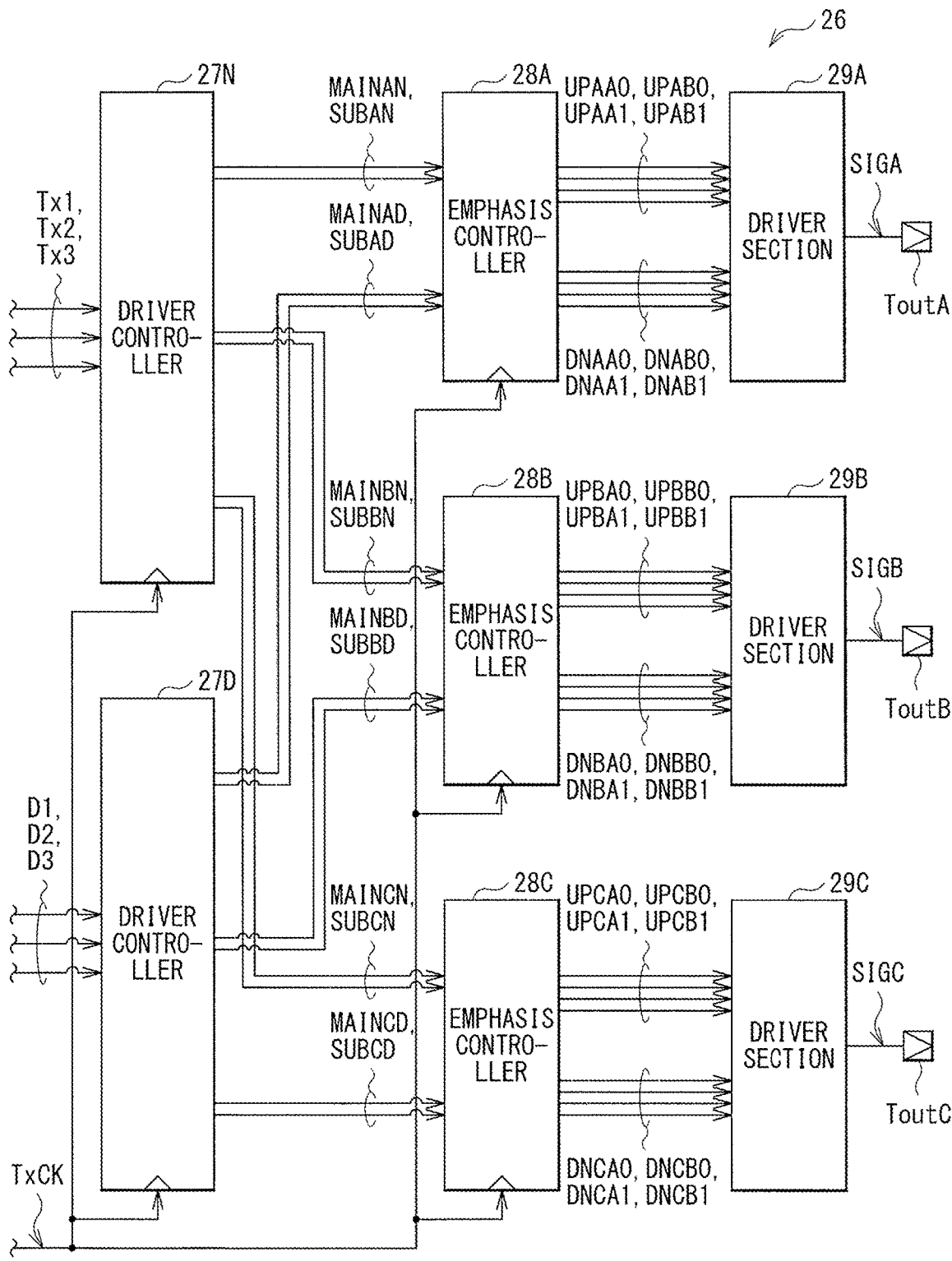

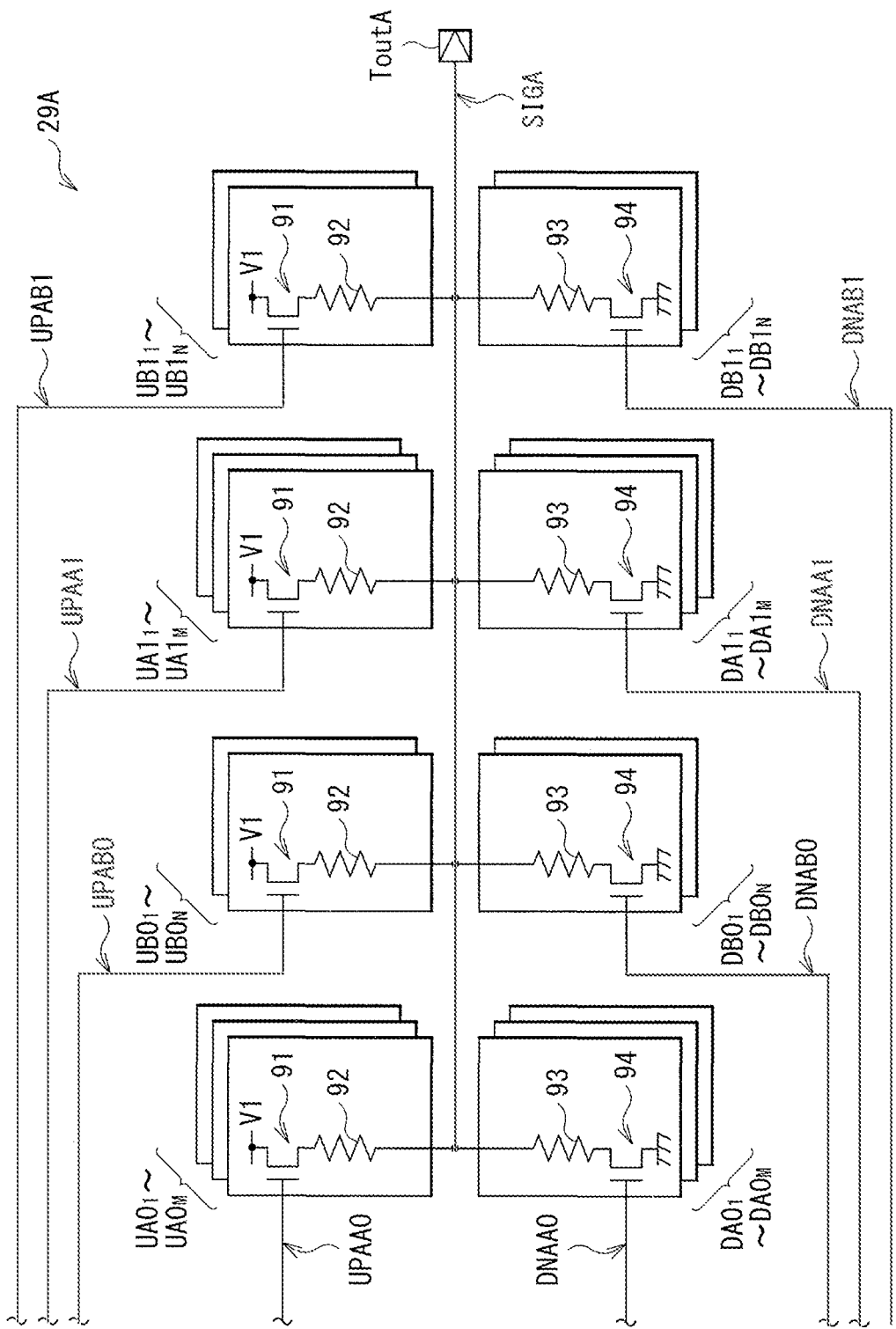
[FIG. 8]

[FIG. 9]

| INPUT | | | | OUTPUT | | | | | | | | SIGA |
|---|---|---|---|---|---|---|---|---|---|---|---|---|
| SIGNAL MAINAD | SIGNAL SUBAD | SIGNAL MAINAN | SIGNAL SUBAN | SIGNAL UPAA0 | SIGNAL UPAB0 | SIGNAL UPAA1 | SIGNAL UPAB1 | SIGNAL DNAA0 | SIGNAL DNAB0 | SIGNAL DNAA1 | SIGNAL DNAB1 | |
| 0 | 0 | 0 | 0 | 1 | 1 | 0 | 0 | 1 | 1 | 0 | 0 | VM0 |
| 1 | 1 | 0 | 0 | 1 | 1 | 0 | 0 | 1 | 1 | 0 | 0 | VM0 |
| 0 | 1 | 0 | 0 | 1 | 1 | 1 | 0 | 1 | 0 | 0 | 0 | VM1plus |
| 0 | 0 | 1 | 0 | 0 | 0 | 0 | 1 | 1 | 1 | 0 | 1 | VM1minus |
| 1 | 0 | 1 | 0 | 0 | 0 | 0 | 0 | 1 | 1 | 1 | 1 | VL2 |
| 0 | 0 | 1 | 0 | 0 | 1 | 0 | 0 | 0 | 0 | 1 | 0 | VL1 |
| 1 | 1 | 1 | 0 | 0 | 0 | 0 | 0 | 0 | 0 | 1 | 0 | VL1 |
| 0 | 1 | 1 | 0 | 0 | 1 | 0 | 1 | 0 | 0 | 1 | 0 | VL0 |
| 0 | 0 | 0 | 1 | 1 | 0 | 1 | 1 | 1 | 1 | 0 | 1 | VH2 |
| 0 | 0 | 1 | 1 | 1 | 0 | 1 | 1 | 1 | 0 | 0 | 1 | VH1 |
| 0 | 1 | 0 | 1 | 1 | 0 | 1 | 0 | 1 | 0 | 0 | 1 | VH1 |
| 1 | 1 | 1 | 1 | 1 | 1 | 1 | 0 | 1 | 1 | 0 | 0 | VH0 |
| 1 | 0 | 1 | 1 | 1 | 1 | 0 | 0 | 1 | 1 | 0 | 0 | VM0 |
| 1 | 1 | 1 | 1 | 1 | 1 | 0 | 1 | 0 | 1 | 0 | 0 | VM0 |
| 0 | 1 | 1 | 1 | 1 | 0 | 0 | 0 | 0 | 0 | 0 | 0 | VM1plus |
| 1 | 0 | 1 | 1 | 1 | 0 | 0 | 1 | 1 | 1 | 0 | 1 | VM1minus |

[ FIG. 10A ]
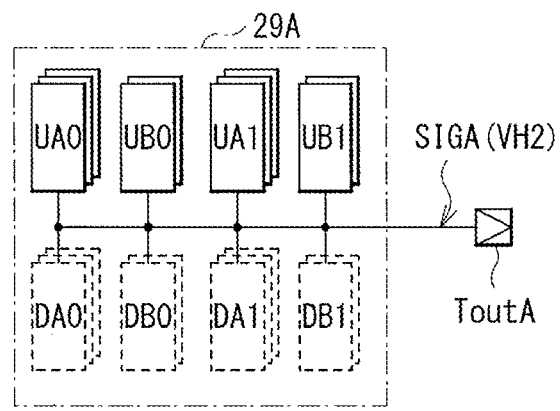
[ FIG. 10B ]
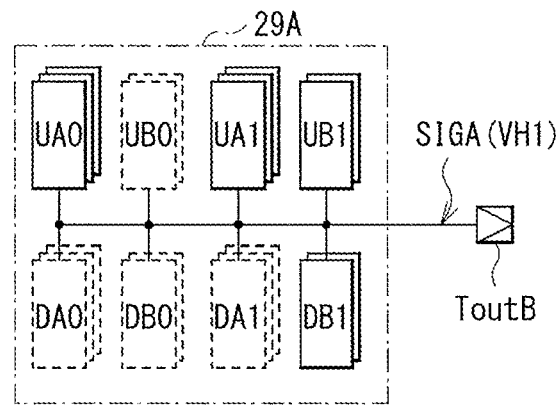
[ FIG. 10C ]
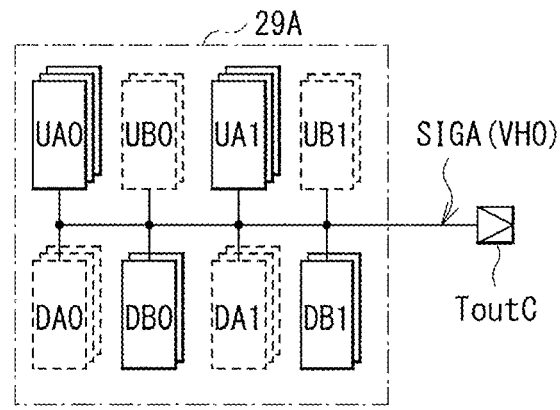

[ FIG. 11A ]
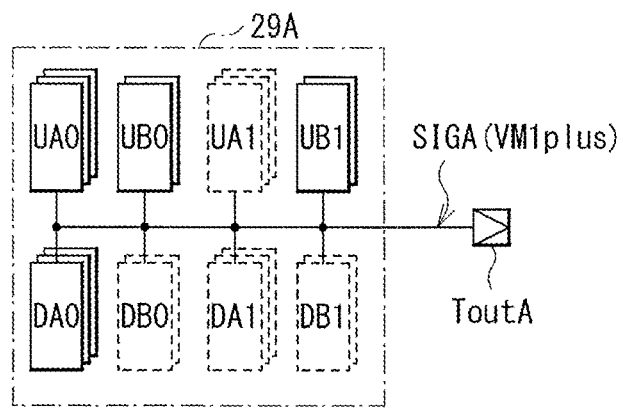
[ FIG. 11B ]
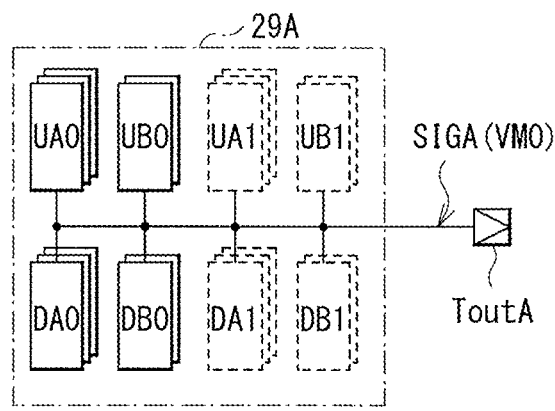
[ FIG. 11C ]
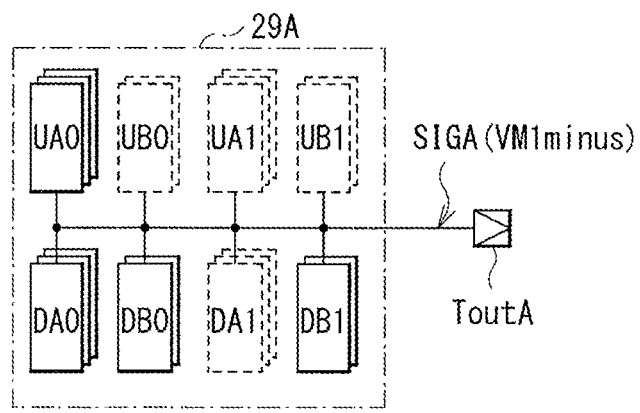

[ FIG. 12A ]
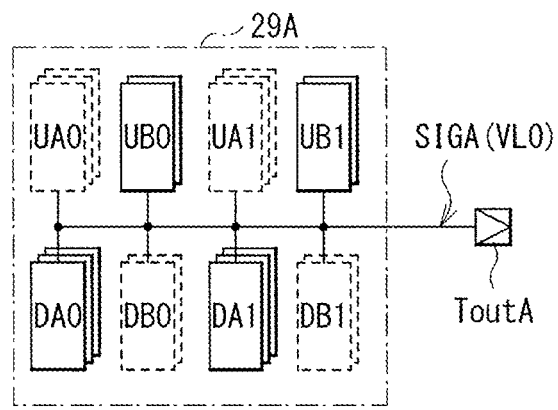
[ FIG. 12B ]
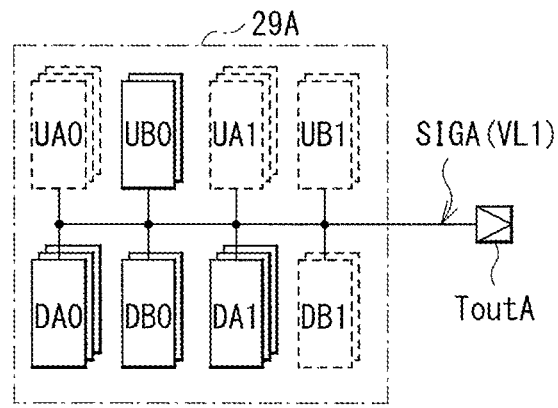
[ FIG. 12C ]
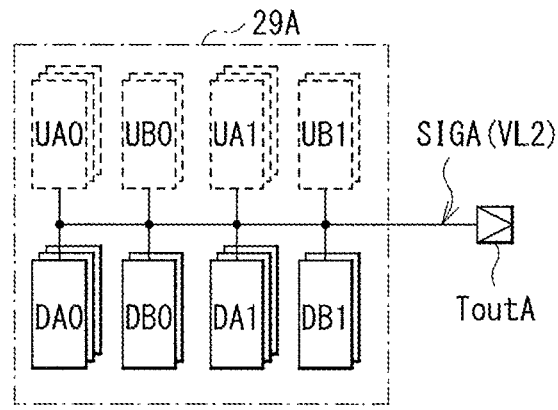

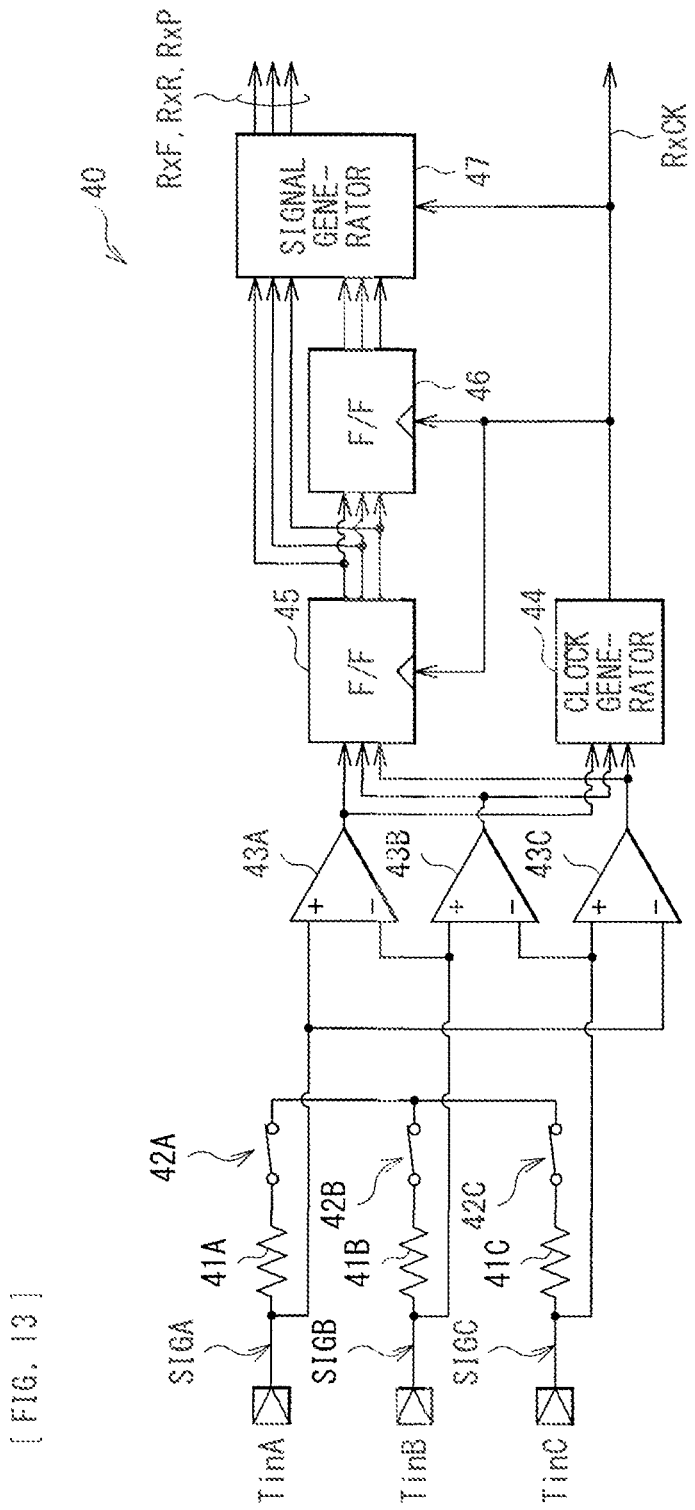
[FIG. 13]

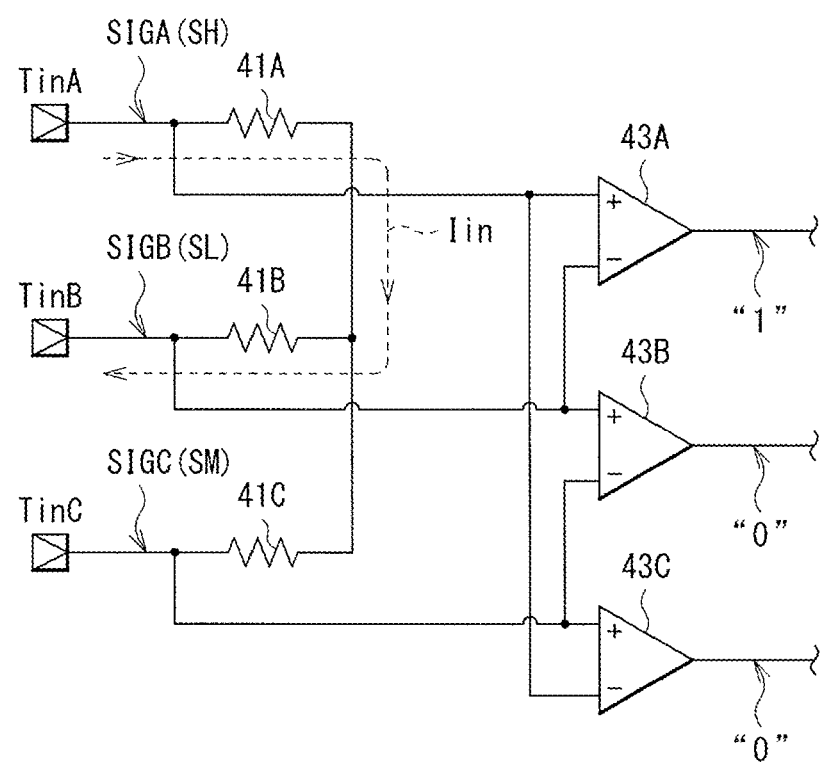
[ FIG. 14 ]

[ FIG. 15A ]
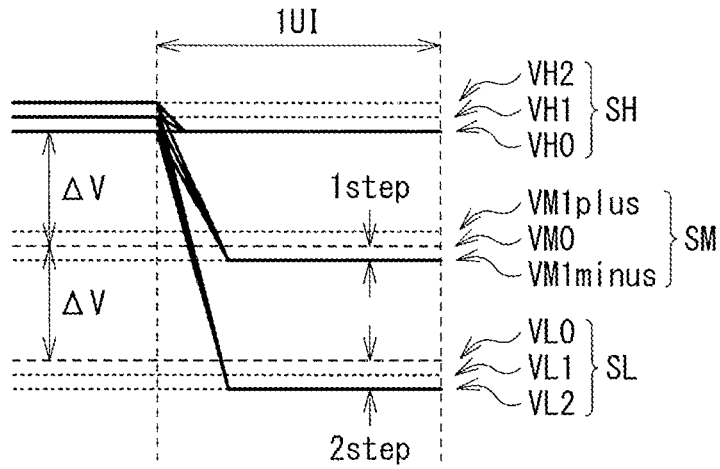
[ FIG. 15B ]
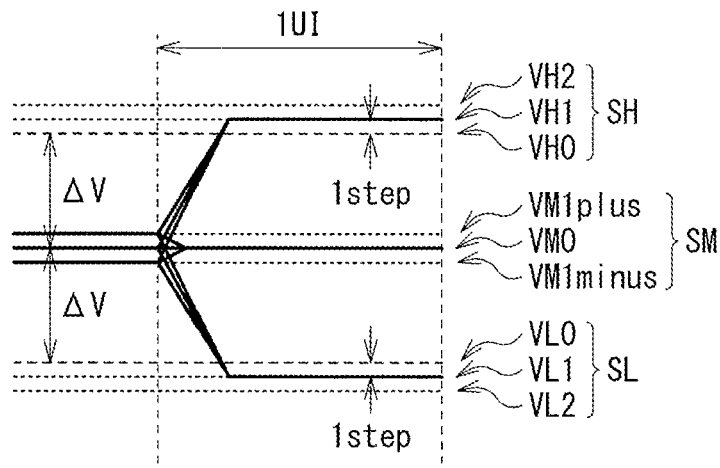
[ FIG. 15C ]
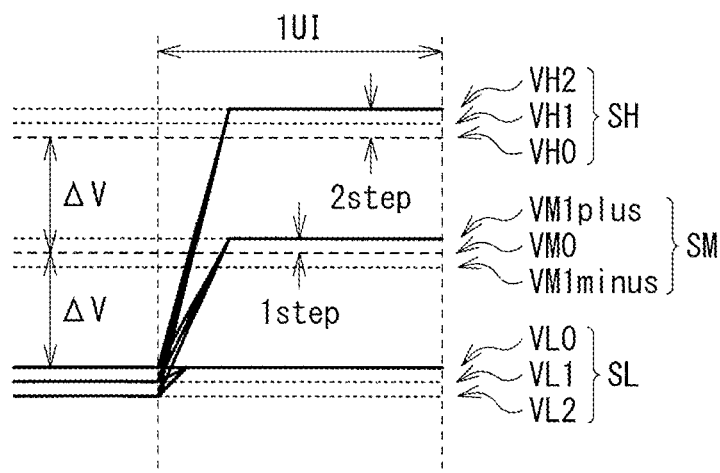

[ FIG. 16A ]
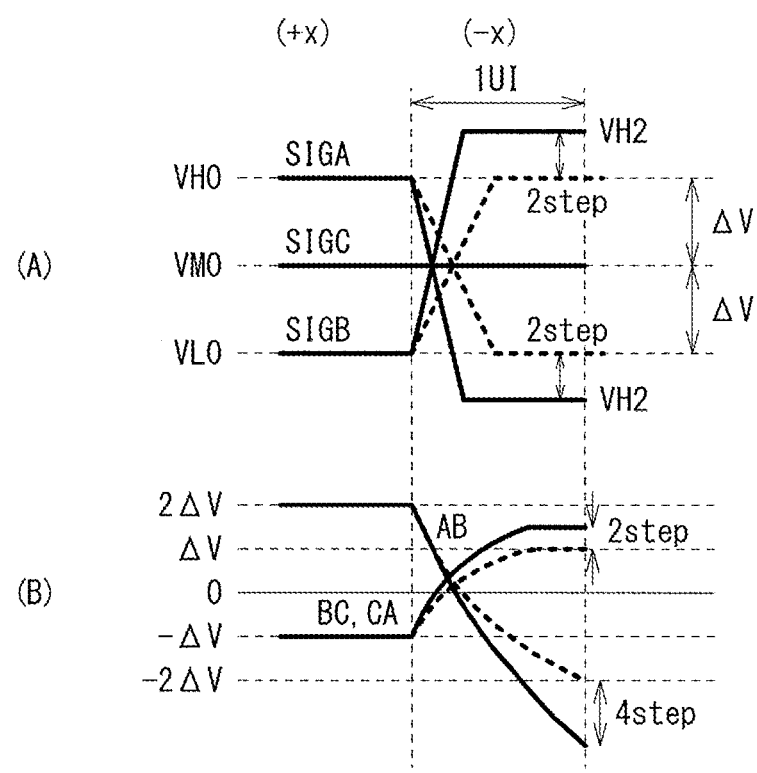

[ FIG. 16B ]
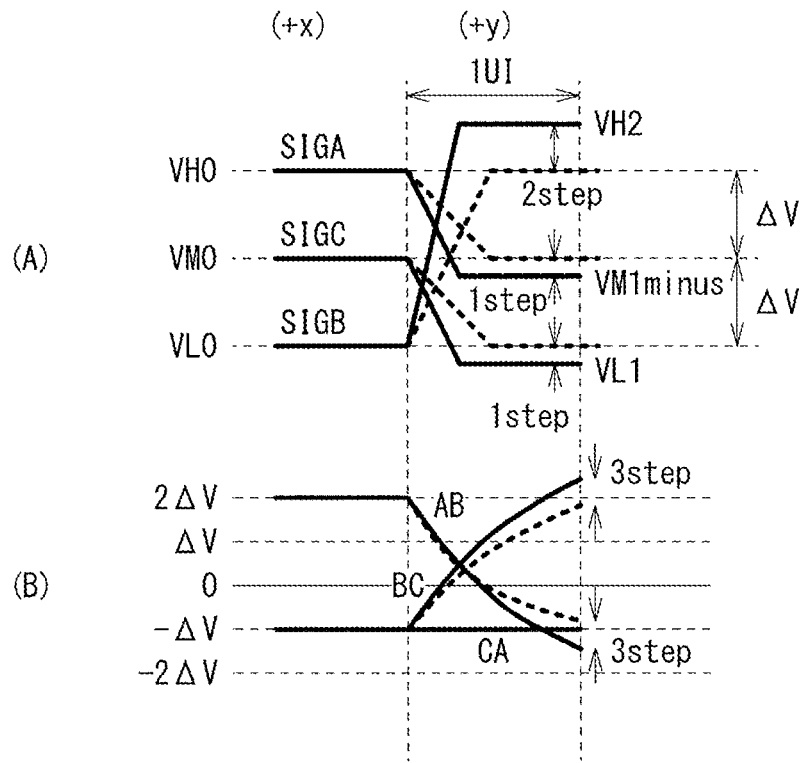
[ FIG. 16C ]
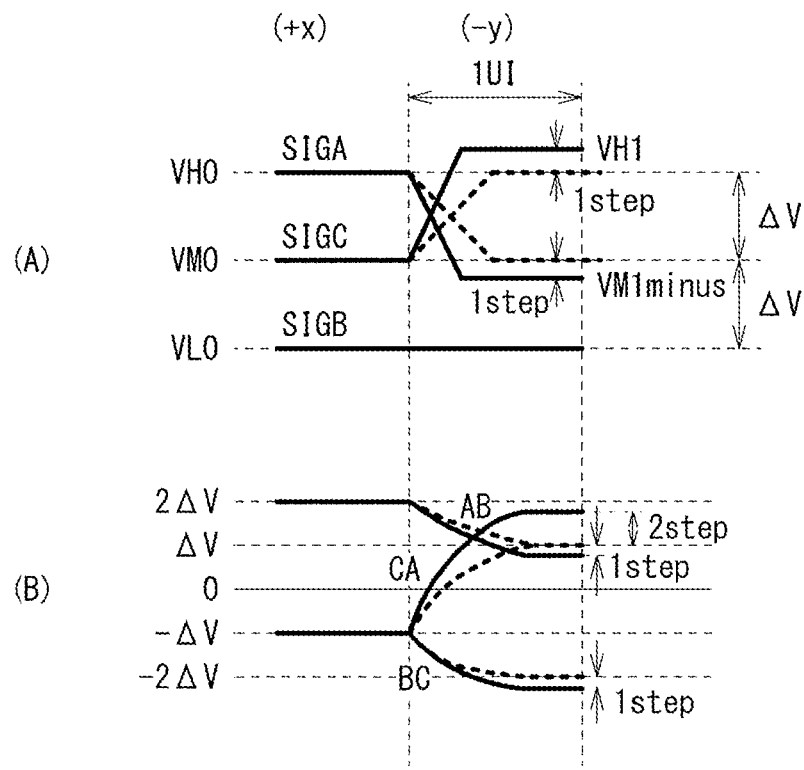

[ FIG. 16D ]
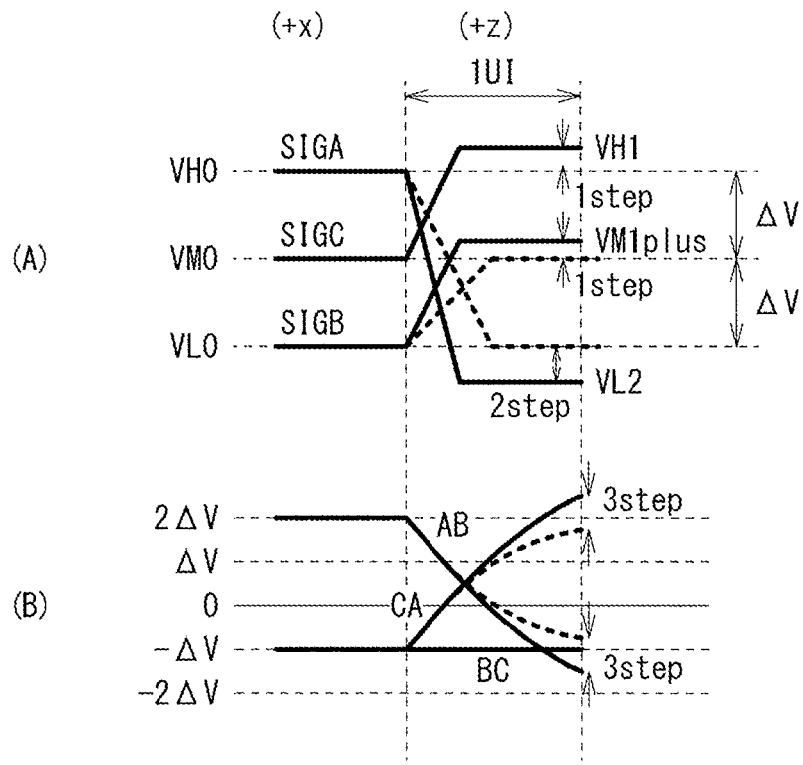
[ FIG. 16E ]
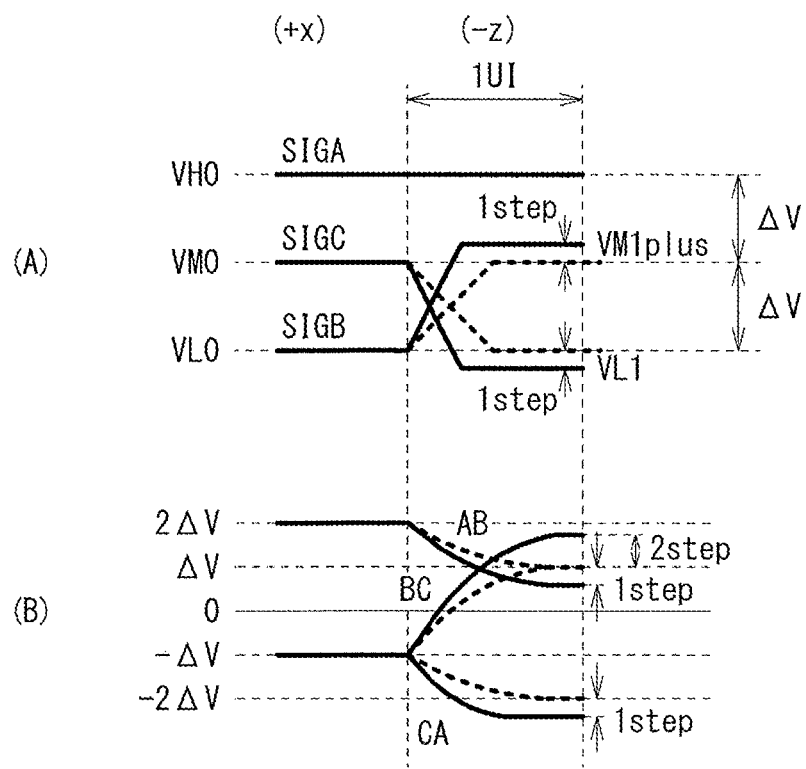

[ FIG. 17A ]
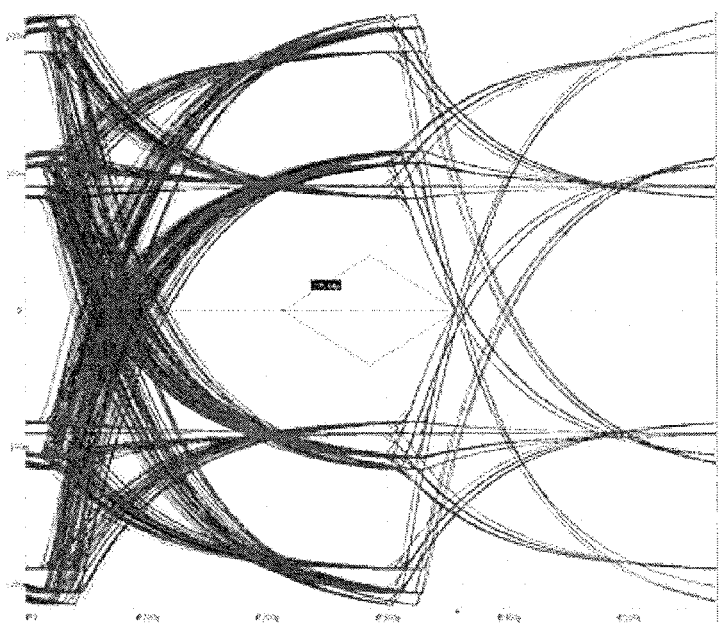
[ FIG. 17B ]
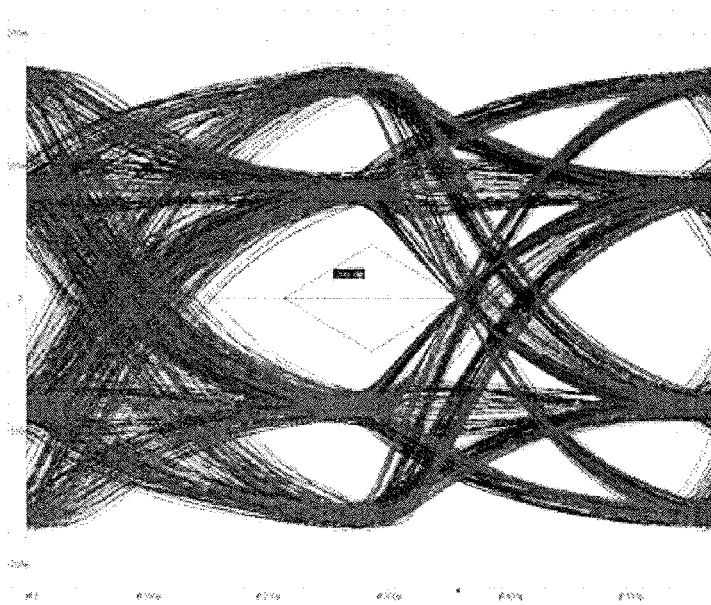

[ FIG. 18A ]
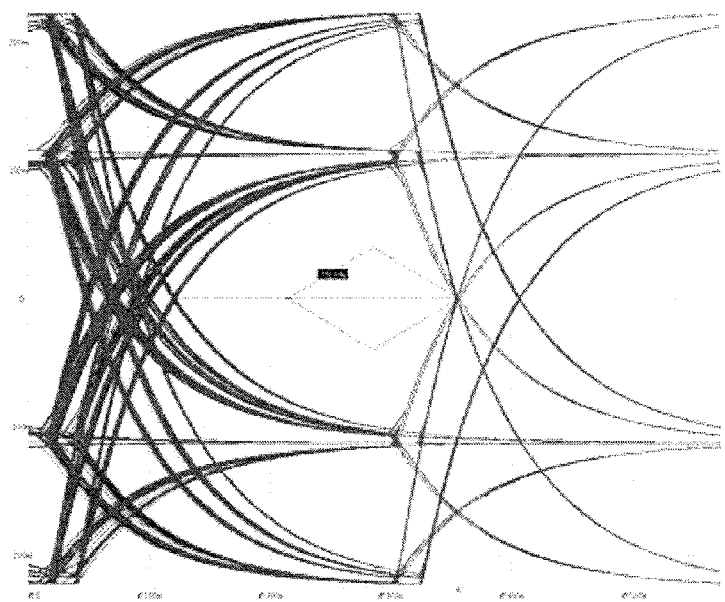
[ FIG. 18B ]
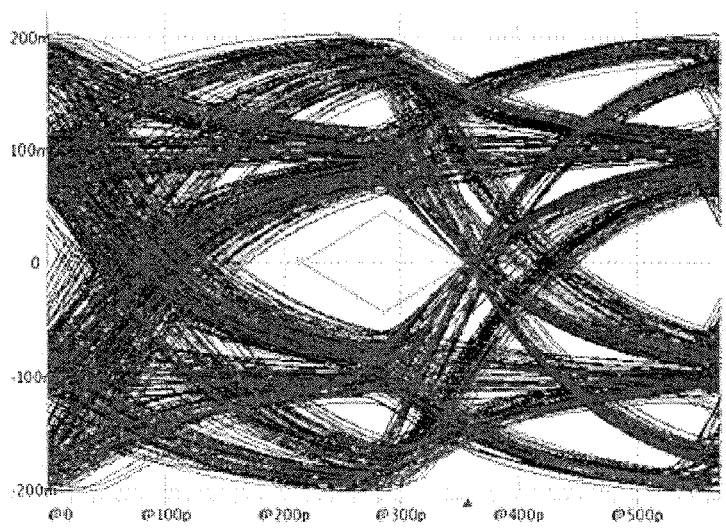

[ FIG. 19A ]
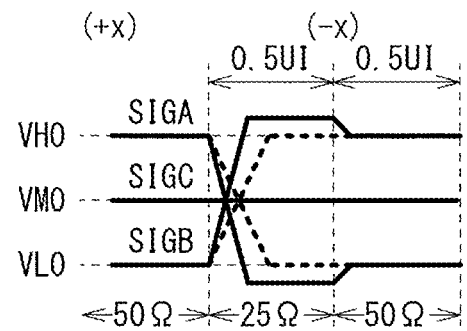
[ FIG. 19B ]
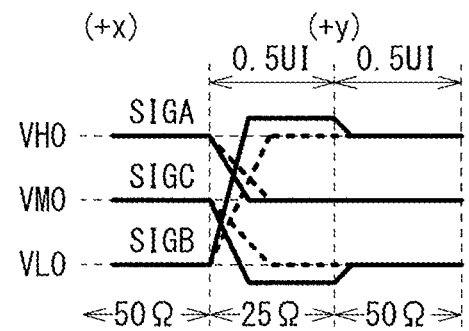
[ FIG. 19C ]
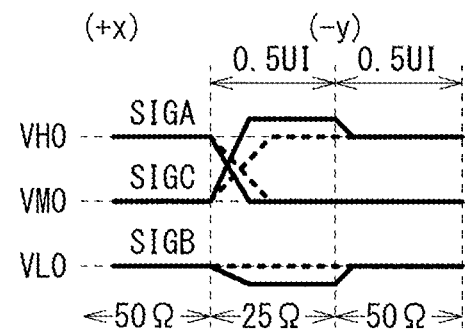

[ FIG. 19D ]
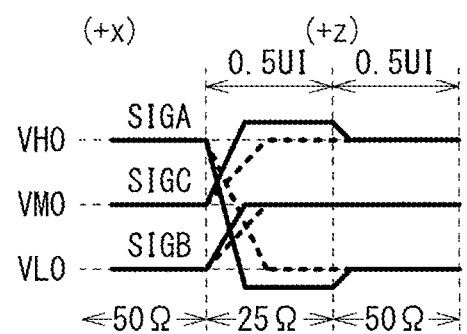
[ FIG. 19E ]
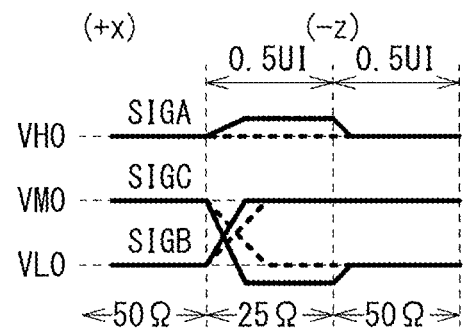

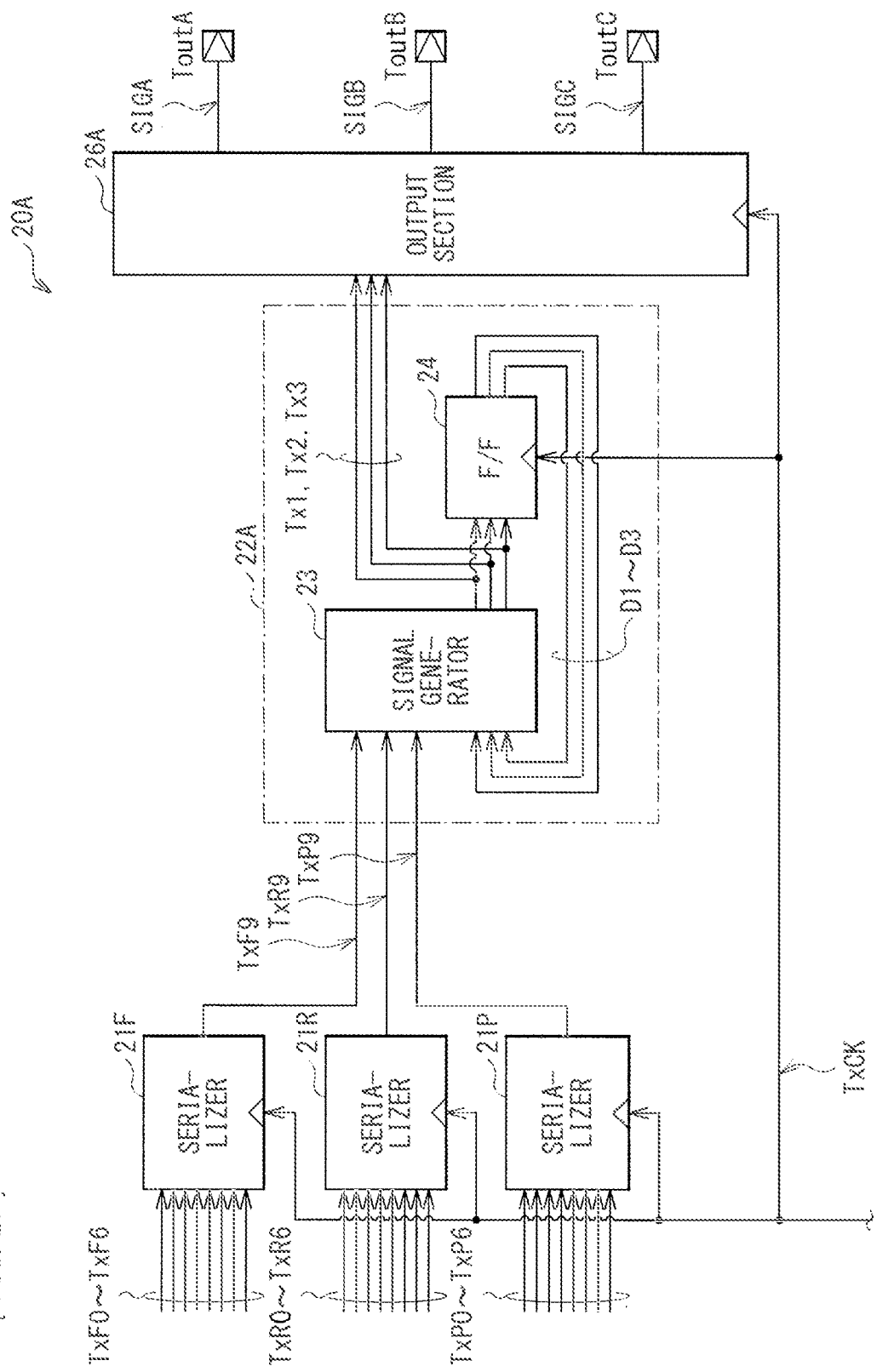
[FIG. 20]

[FIG. 21]
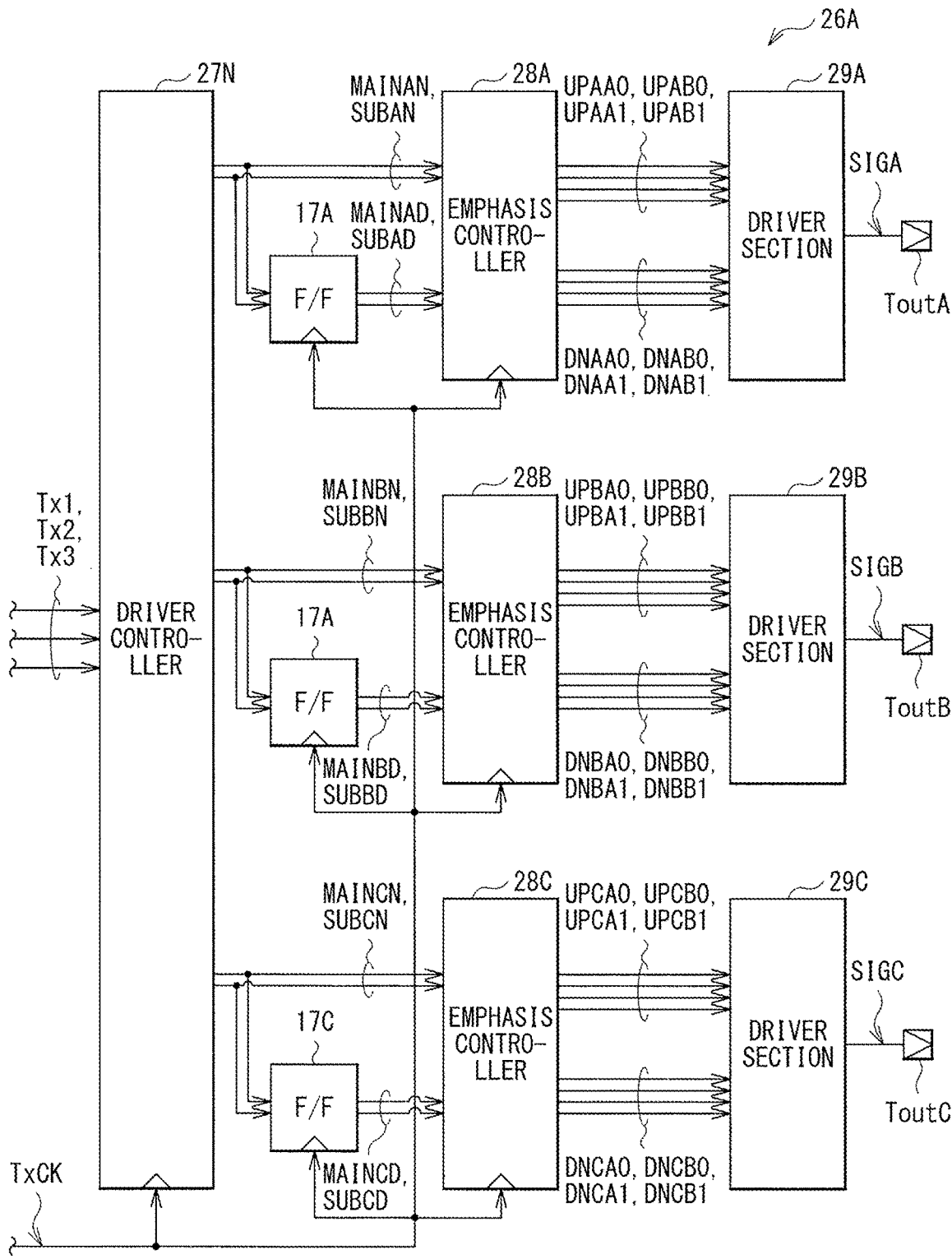

[ FIG. 22 ]
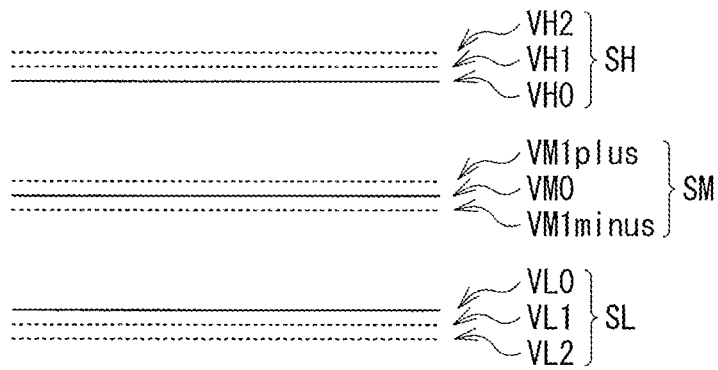
[ FIG. 23 ]
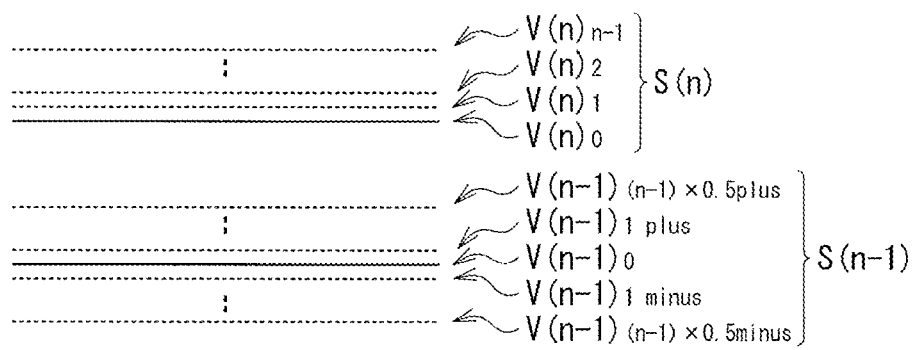
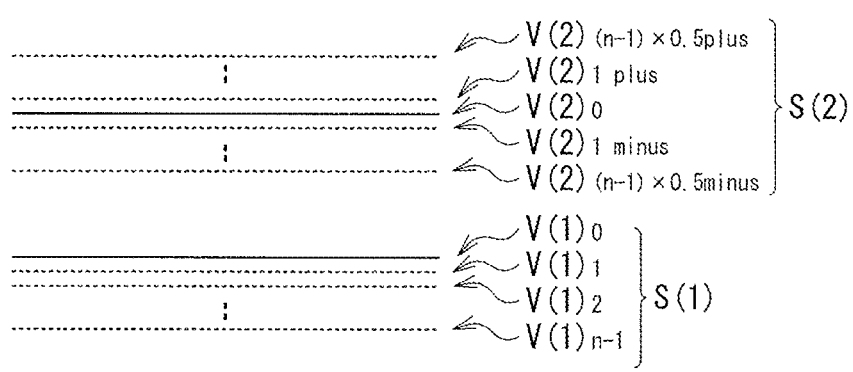

[ FIG. 24 ]
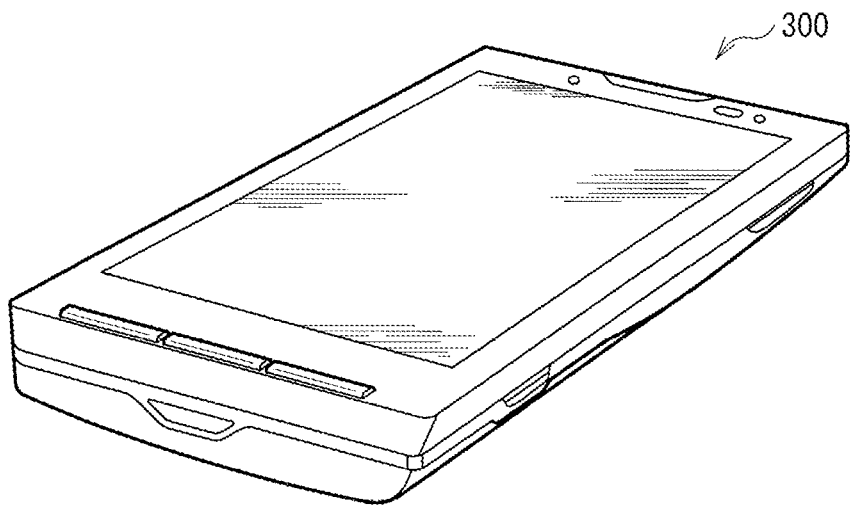

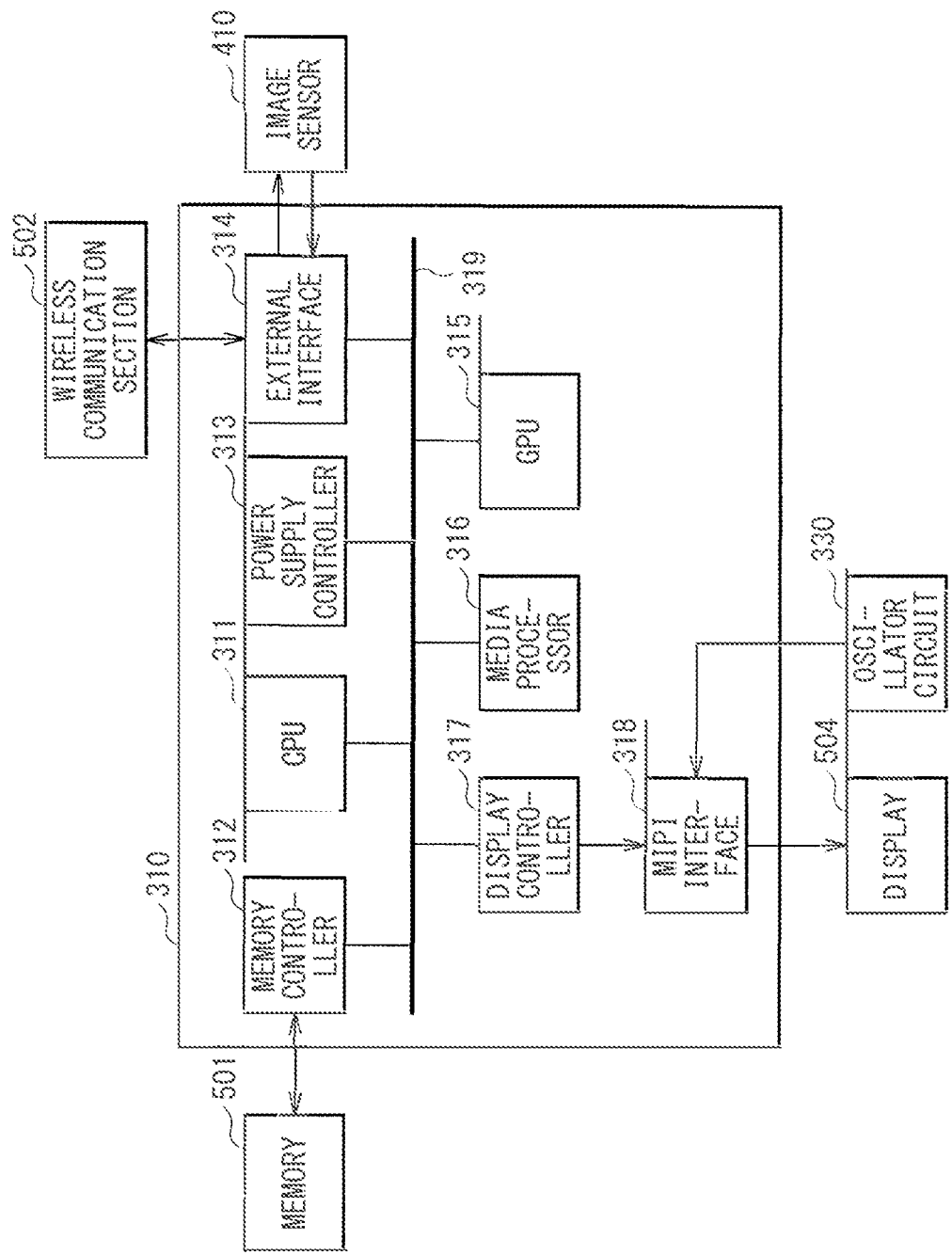
[FIG. 25]

[FIG. 26]
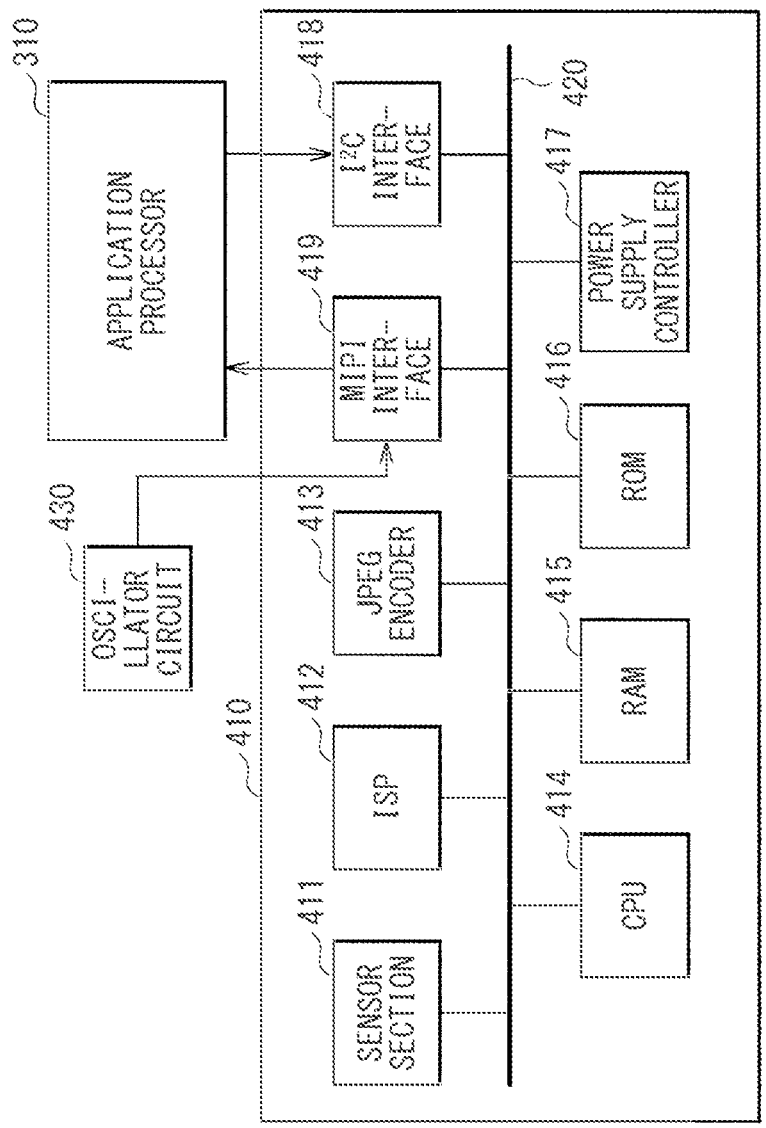

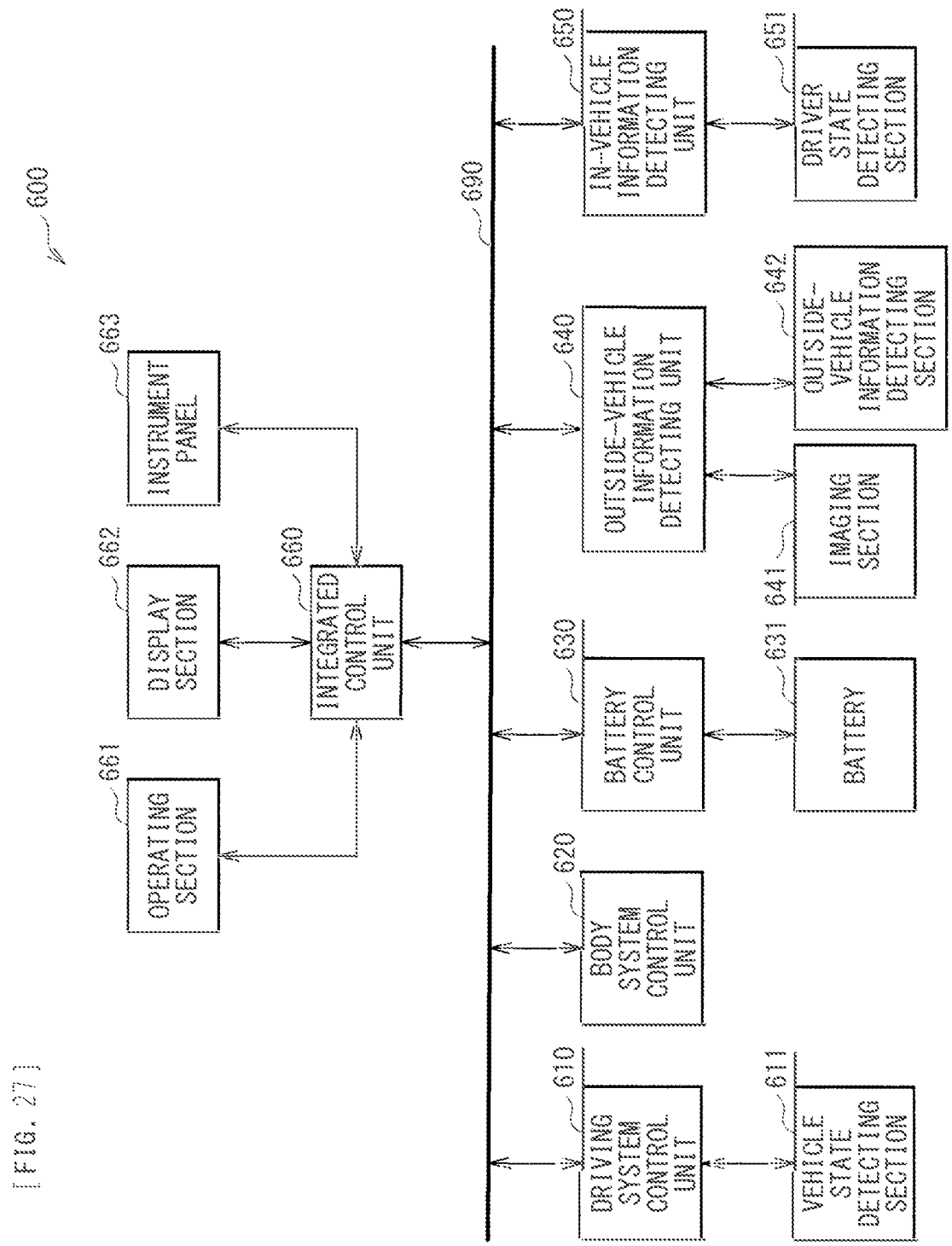
[FIG. 27]

TRANSMISSION DEVICE, TRANSMISSION METHOD, AND COMMUNICATION SYSTEM

APPLICATION CROSS-REFERENCE

This Application is a continuation application of application Ser. No. 16/074,260, filed Jul. 31, 2018 and which claims the benefit of Japanese Priority Patent Application JP2016-031222 filed with the Japan Patent Office on Feb. 22, 2016, the entire contents of which are incorporated herein by reference.

TECHNICAL FIELD

The disclosure relates to a transmission device that transmits a signal, a transmission method used in such a transmission device, and a communication system including such a transmission device.

BACKGROUND ART

In association with high functionality and multi-functionality of electronic apparatuses in recent years, the electronic apparatuses are mounted with various devices such as a semiconductor chip, a sensor, and a display device. A lot of pieces of data are exchanged between these devices, and the amount of such data has been increased with high functionality and multi-functionality of the electronic apparatuses. Accordingly, the data are often exchanged with use of a high-speed interface. The high-speed interface is able to transmit and receive data at several Gbps, for example.

There have been disclosed various techniques in order to improve communication performance at a high-speed interface. For example, PTL1 and PTL2 each disclose a communication system that transmits three differential signals by using three transmission paths. Further, PTL 3 discloses a communication system that performs pre-emphasis.

CITATION LIST

Patent Literature

PTL1: Japanese Unexamined Patent Application Publication No. H06-261092
PTL2: U.S. Pat. No. 8,064,535
PTL3: Japanese Unexamined Patent Application Publication No. 2011-142382

SUMMARY OF THE INVENTION

As described, it is desired to improve communication performance, and further improvement of the communication performance is expected in a communication system.

It is desirable to provide a transmission device, a transmission method, and a communication system that make it possible to improve communication performance.

A transmission device according to an embodiment of the disclosure includes a driver section and a control section. The driver section is able to transmit a data signal by using three or more predetermined number of voltage states and set voltages in each of the voltage states. The control section sets an emphasis voltage that is based on a transition among the predetermined number of the voltage states, and thereby causes the driver section to perform emphasis.

A transmission method according to an embodiment of the disclosure includes transmitting a data signal by using three or more predetermined number of voltage states, and setting an emphasis voltage that is based on a transition among the predetermined number of the voltage states, and thereby performing emphasis.

A communication system according to an embodiment of the disclosure includes a transmission device and a reception device. The transmission device includes a driver section and a control section. The driver section is able to transmit a data signal by using three or more predetermined number of voltage states and set voltages in each of the voltage states. The control section sets an emphasis voltage that is based on a transition among the predetermined number of the voltage states, and thereby causes the driver section to perform emphasis.

In the transmission device, the transmission method, and the communication system according to the respective embodiments of the disclosure, the data signal is transmitted by using the three or more predetermined number of voltage states. The voltages in each of the voltage states are each settable. Further, the emphasis voltage that is based on the transition among the predetermined number of the voltage states is set, and thereby the emphasis is performed.

According to the transmission device, the transmission method, and the communication system according to the respective embodiments of the disclosure, the emphasis is performed by setting the emphasis voltage that is based on the transition among the predetermined number of the voltage states, which makes it possible to improve the communication performance. It is to be noted that the effects described here are not necessarily limitative, and may have any of the effects described in the disclosure.

BRIEF DESCRIPTION OF DRAWINGS

FIG. 1 is a block diagram illustrating a configuration example of a communication system according to an embodiment of the disclosure.

FIG. 2 is a diagram describing a voltage state of a signal transmitted and received by the communication system illustrated in FIG. 1.

FIG. 3 is another diagram describing a voltage state of a signal transmitted and received by the communication system illustrated in FIG. 1.

FIG. 4 is a diagram describing a transition of a symbol transmitted and received by the communication system illustrated in FIG. 1.

FIG. 5 is a block diagram illustrating a configuration example of a transmitter illustrated in FIG. 1.

FIG. 6 is a table illustrating an operation example of a transmission symbol generator illustrated in FIG. 5.

FIG. 7 is a block diagram illustrating a configuration example of an output section illustrated in FIG. 5.

FIG. 8 is a block diagram illustrating a configuration example of a driver section illustrated in FIG. 7.

FIG. 9 is a table illustrating an operation example of an emphasis controller illustrated in FIG. 7.

FIG. 10A is a diagram describing an operation example of the driver section illustrated in FIG. 7.

FIG. 10B is a diagram describing another operation example of the driver section illustrated in FIG. 7.

FIG. 10C is a diagram describing another operation example of the driver section illustrated in FIG. 7.

FIG. 11A is a diagram describing another operation example of the driver section illustrated in FIG. 7.

FIG. 11B is a diagram describing another operation example of the driver section illustrated in FIG. 7.

FIG. 11C is a diagram describing another operation example of the driver section illustrated in FIG. 7.

FIG. 12A is a diagram describing another operation example of the driver section illustrated in FIG. 7.

FIG. 12B is a diagram describing another operation example of the driver section illustrated in FIG. 7.

FIG. 12C is a diagram describing another operation example of the driver section illustrated in FIG. 7.

FIG. 13 is a block diagram illustrating a configuration example of a receiver illustrated in FIG. 1.

FIG. 14 is a diagram describing an example of a receiving operation of the receiver illustrated in FIG. 13.

FIG. 15A is a timing waveform chart illustrating an operation example of a transmitter illustrated in FIG. 7.

FIG. 15B is a timing waveform chart illustrating another operation example of the transmitter illustrated in FIG. 7.

FIG. 15C is a timing waveform chart illustrating another operation example of the transmitter illustrated in FIG. 7.

FIG. 16A is a timing waveform chart illustrating an operation example of the communication system illustrated in FIG. 1.

FIG. 16B is a timing waveform chart illustrating another operation example of the communication system illustrated in FIG. 1.

FIG. 16C is a timing waveform chart illustrating another operation example of the communication system illustrated in FIG. 1.

FIG. 16D is a timing waveform chart illustrating another operation example of the communication system illustrated in FIG. 1.

FIG. 16E is a timing waveform chart illustrating another operation example of the communication system illustrated in FIG. 1.

FIG. 17A is an eye diagram illustrating an example of a signal in a case where there is no transmission path, when performing de-emphasis operation.

FIG. 17B is an eye diagram illustrating an example of a signal in a case of having passed through a transmission path, when performing de-emphasis operation.

FIG. 18A is an eye diagram illustrating an example of a signal in a case where there is no transmission path, when not performing de-emphasis operation.

FIG. 18B is an eye diagram illustrating an example of a signal in a case of having passed through a transmission path, when not performing de-emphasis operation.

FIG. 19A is a timing waveform diagram illustrating an operation example of a communication system according to a comparative example FIG. 19B is a timing waveform diagram illustrating another operation example of the communication system according to the comparative example.

FIG. 19C is a timing waveform diagram illustrating another operation example of the communication system according to the comparative example.

FIG. 19D is a timing waveform diagram illustrating another operation example of the communication system according to the comparative example.

FIG. 19E is a timing waveform diagram illustrating another operation example of the communication system according to the comparative example.

FIG. 20 is a block diagram illustrating a configuration example of a transmitter according to a modification example.

FIG. 21 is a block diagram illustrating a configuration example of an output section illustrated in FIG. 20.

FIG. 22 is a diagram describing a voltage state of a signal transmitted and received by a communication system according to another modification example.

FIG. 23 is a diagram describing a voltage state of a signal transmitted and received by a communication system according to another modification example.

FIG. 24 is a perspective view illustrating an appearance configuration of a smartphone to which a communication system according to an embodiment is applied.

FIG. 25 is a block diagram illustrating a configuration example of an application processor to which a communication system according to an embodiment is applied.

FIG. 26 is a block diagram illustrating a configuration example of an image sensor to which a communication system according to an embodiment is applied.

FIG. 27 is a block diagram illustrating a configuration example of a vehicle control system to which a communication system according to an embodiment is applied.

MODES FOR CARRYING OUT THE INVENTION

In the following, some embodiments of the disclosure are described in detail with reference to the drawings. It is to be noted that descriptions are given in the following order.
1. Embodiments
2. Application Examples

1. Embodiments

Configuration Example

FIG. 1 illustrates a configuration example of a communication system (communication system 1) according to an embodiment. The communication system 1 achieves the improvement of communication performance by de-emphasis.

The communication system 1 includes a transmission device 10, a transmission path 100, and a reception device 30. The transmission device 10 includes three output terminals ToutA, ToutB, and ToutC. The transmission path 100 includes lines 110A, 110B, and 110C. The reception device 30 includes three input terminals TinA, TinB, and TinC. In addition, the output terminal ToutA of the transmission device 10 and the input terminal TinA of the reception device 30 are coupled to each other via the line 110A, the output terminal ToutB of the transmission device 10 and the input terminal TinB of the reception device 30 are coupled to each other via the line 110B, and the output terminal ToutC of the transmission device 10 and the input terminal TinC of the reception device 30 are coupled to each other via the line 110C. In this example, each of the lines 110A to 110C has a characteristic impedance of about 50 [Ω].

The transmission device 10 outputs a signal SIGA from the output terminal ToutA, outputs a signal SIGB from the output terminal ToutB, and outputs a signal SIGC from the output terminal ToutC. Further, the reception device 30 receives the signal SIGA via the input terminal TinA, receives the signal SIGB via the input terminal TinB, and receives the signal SIGC via the input terminal TinC. Each of the signals SIGA, SIGB, and SIGC may take three voltage states SH, SM, and SL.

FIG. 2 illustrates the three voltage states SH, SM, and SL. The voltage state SH is a state that corresponds to three high level voltages VH (VH0, VH1, and VH2). Among the high level voltages VH0, VH1, and VH2, the high level voltage VH0 is the lowest voltage. The high level voltage VH2 is the highest voltage. The voltage state SM is a state that corresponds to three intermediate level voltages VM (VM0, VM1plus, and VM1minus). Among the intermediate level voltages VM0, VM1plus, and VM1minus, the intermediate level voltage VM1minus is the lowest voltage. The intermediate level voltage VM1plus is the highest voltage. The voltage state SL is a state that corresponds to three low level voltages VL (VL0, VL1, and VL2). Among the low level voltages VL0, VL1, and VL2, the low level voltage VL0 is the highest voltage. The low level voltage VL2 is the lowest voltage. The high level voltage VH2 is a high level voltage in a case of not applying de-emphasis. The intermediate level voltage VM0 is an intermediate level voltage in a case of not applying de-emphasis. The low level voltage VL2 is a low level voltage in a case of not applying de-emphasis.

FIG. 3 illustrates voltage states of the signals SIGA, SIGB, and SIGC. The transmission device 10 transmits six symbols "+x", "−x", "+y", "−y", "+z", and "−z", using the three signals SIGA, SIGB, and SIGC. For example, in a case of transmitting the symbol "+x", the transmission device 10 sets the signal SIGA to the voltage state SH, sets the signal SIGB to the voltage state SL, and sets the signal SIGC to the voltage state SM. In a case of transmitting the symbol "−x", the transmission device 10 sets the signal SIGA to the voltage state SL, sets the signal SIGB to the voltage state SH, and sets the signal SIGC to the voltage state SM. In a case of transmitting the symbol "+y", the transmission device 10 sets the signal SIGA to the voltage state SM, sets the signal SIGB to the voltage state SH, and sets the signal SIGC to the voltage state SL. In a case of transmitting the symbol "−y", the transmission device 10 sets the signal SIGA to the voltage state SM, sets the signal SIGB to the voltage state SL, and sets the signal SIGC to the high level voltage SH. In a case of transmitting the symbol "+z", the transmission device 10 sets the signal SIGA to the voltage state SL, sets the signal SIGB to the voltage state SM, and sets the signal SIGC to the voltage state SH. In a case of transmitting the symbol "−z", the transmission device 10 sets the signal SIGA to the voltage state SH, sets the signal SIGB to the voltage state SM, and sets the signal SIGC to voltage state SL.

The transmission path 100 transmits a sequence of a symbol, using such signals SIGA, SIGB, and SIGC. In other words, the three lines 110A, 110B, and 110C function as one lane through which the sequence of the symbol is transmitted.

(Transmission Device 10)

As illustrated in FIG. 1, the transmission device 10 includes a clock generator 11, a processor 12, and a transmitter 20.

The clock generator 11 generates a clock signal TxCK. The clock signal TxCK has a frequency of 2.5 [GHz], for example. It is to be noted that the clock signal TxCK is not limited thereto, and may also have a frequency of 1.25 [GHz], for example, in a case of using what is called a half rate architecture to configure a circuit in the transmission device 10. The clock generator 11 includes, for example, a PLL (phase-locked loop), and generates the clock signal TxCK on the basis of a reference clock (not illustrated) to be supplied from the outside of the transmission device 10, for example. Thereafter, the clock generator 11 supplies this clock signal TxCK to the processor 12 and the transmitter 20.

The processor 12 generates transition signals TxF0 to TxF6, TxR0 to TxR6, and TxP0 to TxP6 by performing predetermined processing. Here, a set of transition signals TxF0, TxR0, and TxP0 indicates a transition of a symbol in a sequence of the symbol to be transmitted by the transmission device 10. Likewise, a set of transition signals TxF1, TxR1, and TxP1 indicates a transition of the symbol, a set of transition signals TxF2, TxR2, and TxP2 indicates a transition of the symbol, a set of transition signals TxF3, TxR3, and TxP3 indicates a transition of the symbol, a set of transition signals TxF4, TxR4, and TxP4 indicates a transition of the symbol, a set of transition signals TxF5, TxR5, and TxP5 indicates a transition of the symbol, and a set of transition signals TxF6, TxR6, and TxP6 indicates a transition of the symbol. In other words, the processor 12 generates seven sets of transition signals. In the following, transition signals TxF, TxR, and TxP are used as appropriate to represent any set among the seven sets of transition signals.

FIG. 4 illustrates a relationship between the transition signals TxF, TxR, and TxP and the transitions of the symbols. A three-digit numerical value assigned to each transition indicates values of the transition signals TxF, TxR, and TxP in this order.

The transition signal TxF (Flip) causes the symbol to make a transition between "+x" and "−x", causes the symbol to make a transition between "+y" and "−y", and causes the symbol to make a transition between "+z" and "−z". Specifically, in a case where the transition signal TxF is "1", the symbol is caused to make a transition to change a polarity thereof (for example, from "+x" to "−x"), and in a case where the transition signal TxF is "0", such a transition is not performed.

In a case where the transition signal TxF is "0", the transition signals TxR (Rotation) and TxP (Polarity) cause the symbol to make a transition between "+x" and those other than "−x", between "+y" and those other than "−y", and between "+z" and those other than "−z". Specifically, in a case where the transition signals TxR and TxP are "1" and "0", the symbol, while keeping the polarity, is caused to make a transition clockwise (for example, from "+x" to "+y") in FIG. 4. In a case where the transition signals TxR and TxP are "1" and "1", the symbol is caused to change the polarity and transition clockwise (for example, from "+x" to "−y") in FIG. 4. Further, in a case where the transition signals TxR and TxP are "0" and "0", the symbol, while keeping the polarity, is caused to make a transition counterclockwise (for example, from "+x" to "+z") in FIG. 4. In a case where the transition signals TxR and TxP are "0" and "1", the symbol is caused to change the polarity and transition counterclockwise (for example, from "+x" to "−z") in FIG. 4.

The processor 12 generates seven sets of such transition signals TxF, TxR, and TxP. Further, the processor 12 supplies these seven sets of transition signals TxF, TxR, and TxP (transition signals TxF0 to TxF6, TxR0 to TxR6, and TxP0 to TxP6) to the transmitter 20.

The transmitter 20 generates the signals SIGA, SIGB, and SIGC on the basis of the transition signals TxF0 to TxF6, TxR0 to TxR6, and TxP0 to TxP6.

FIG. 5 illustrates a configuration example of the transmitter 20. The transmitter 20 includes serializers 21F, 21R, and 21P, a transmission symbol generator 22, and an output section 26.

The serializer 21F generates a transition signal TxF9 by serializing the transition signals TxF0 to TxF6 in this order on the basis of the transition signals TxF0 to TxF6 and the clock signal TxCK. The serializer 21R generates a transition signal TxR9 by serializing the transition signals TxR0 to TxR6 in this order on the basis of the transition signals TxR0 to TxR6 and the clock signal TxCK. The serializer 21P generates a transition signal TxP9 by serializing the transition signals TxP0 to TxP6 in this order on the basis of the transition signals TxP0 to TxP6 and the clock signal TxCK.

The transmission symbol generator 22 generates symbol signals Tx1, Tx2, and Tx3 and symbol signals D1, D2, and D3 on the basis of the transition signals TxF9, TxR9, and TxP9 and the clock signal TxCK. The transmission symbol generator 22 includes a signal generator 23 and a flip-flop 24.

The signal generator 23 generates the symbol signals Tx1, Tx2, and Tx3 relating to a current symbol NS on the basis of the transition signals TxF9, TxR9, and TxP9 and symbol signals D1, D2, and D3. Specifically, the signal generator 23 determines, on the basis of the symbol indicated by the symbol signals D1, D2, and D3 (a symbol DS that is earlier by one symbol) and the transition signals TxF9, TxR9, and TxP9, the current symbol NS as illustrated in FIG. 3 and outputs the symbol NS as the symbol signals Tx1, Tx2, and Tx3.

The flip-flop 24 performs sampling of the symbol signals Tx1, Tx2, and Tx3 on the basis of the clock signal TxCK, and outputs results of the sampling, respectively, as the symbol signals D1, D2, and D3.

FIG. 6 illustrates an operation example of the transmission symbol generator 22. This FIG. 6 illustrates the symbol NS to be generated on the basis of the symbol DS indicated by the symbol signals D1, D2, and D3 and the transition signals TxF9, TxR9, and TxP9. A case where the symbol DS is "+x" is described as an example. In a case where the transition signals TxF9, TxR9, and TxP9 are "000", the symbol NS is "+z". In a case where the transition signals TxF9, TxR9, and TxP9 are "001", the symbol NS is "−z". In a case where the transition signals TxF9, TxR9, and TxP9 are "010", the symbol NS is "+y". In a case where the transition signals TxF9, TxR9, and TxP9 are "011", the symbol NS is "−y". In a case where the transition signals TxF9, TxR9, and TxP9 are "1xx", the symbol NS is "−x". Here, "x" indicates that any one of "1" and "0" may be adopted. The same applies to a case where the symbol DS is any of "−x", "+y", "−y", "+z", and "−z".

The output section 26 generates the signals SIGA, SIGB, and SIGC on the basis of the symbol signals Tx1, Tx2, and Tx3, the symbol signals D1, D2, and D3, and the clock signal TxCK.

FIG. 7 illustrates a configuration example of the output section 26. The output section 26 includes a driver controller 27N, a driver controller 27D, emphasis controllers 28A, 28B, and 28C, and driver sections 29A, 29B, and 29C.

The driver controller 27N generates signals MAINAN, SUBAN, MAINBN, SUBBN, MAINCN, and SUBCN on the basis of the symbol signals Tx1, Tx2, Tx3, and the clock signal TxCK relating to the current symbol NS. Specifically, the driver controller 27N calculates a voltage state of each of the signals SIGA, SIGB, and SIGC on the basis of the current symbol NS indicated by the symbol signals Tx1, Tx2, and Tx3, as illustrated in FIG. 3. Further, in a case of setting the signal SIGA to the voltage state SH, for example, the driver controller 27N sets the signals MAINAN and SUBAN to "1" and "0", respectively. In a case of setting the signal SIGA to the voltage state SL, the driver controller 27N sets the signals MAINAN and SUBAN to "0" and "1", respectively. In a case of setting the signal SIGA to the voltage state SM, the driver controller 27N sets both the signals MAINAN and SUBAN to "1" or "0". The same applies to the signals MAINBN and SUBBN, and the signals MAINCN and SUBCN. Further, the driver controller 27N supplies the signals MAINAN and SUBAN to the emphasis controller 28A, supplies the signals MAINBN and SUBBN to the emphasis controller 28B, and supplies the signals MAINCN and SUBCN to the emphasis controller 28C.

The driver controller 27D generates signals MAINAD, SUBAD, MAINBD, SUBBD, MAINCD, and SUBCD on the basis of the symbol signals D1, D2, and D3 relating to the symbol DS that is earlier by one symbol and the clock signal TxCK. The driver controller 27D includes the same circuit configuration as that of the driver controller 27N. Further, the driver controller 27D supplies the signals MAINAD and SUBAD to the emphasis controller 28A, supplies the signals MAINBD and SUBBD to the emphasis controller 28B, and supplies the signals MAINCD and SUBCD to the emphasis controller 28C.

The emphasis controller 28A generates eight signals UPAA0, UPAB0, UPAA1, UPAB1, DNAA0, DNAB0, DNAA1, and DNAB1 on the basis of the signals MAINAN and SUBAN and the signals MAINAD and SUBAD. The driver section 69A generates the signal SIGA on the basis of the eight signals UPAA0, UPAB0, UPAA1, UPAB1, DNAA0, DNAB0, DNAA1, and DNAB1.

The emphasis controller 28B generates eight signals UPBA0, UPBB0, UPBA1, UPBB1, DNBA0, DNBB0, DNBA1, and DNBB1 on the basis of the signals MAINBN and SUBBN and the signals MAINBD and SUBBD. The driver section 69A generates the signal SIGB on the basis of the eight signals UPBA0, UPBB0, UPBA1, UPBB1, DNBA0, DNBB0, DNBA1, and DNBB1.

The emphasis controller 28C generates eight signals UPCA0, UPCB0, UPCA1, UPCB1, DNCA0, DNCB0, DNCA1, and DNCB1 on the basis of the signals MAINCN and SUBCN and the signals MAINCD and SUBCD. The driver section 69A generates the signal SIGC on the basis of the eight signals UPCA0, UPCB0, UPCA1, UPCB1, DNCA0, DNCB0, DNCA1, and DNCB1.

FIG. 8 illustrates a configuration example of the driver section 29A. It is to be noted that the same applies to the drive sections 29B and 29C. The driver section 29A includes M number of circuits UA0 (circuits $UA0_1$ to $UA0_M$), N number of circuits UB0 (circuits $UB0_1$ to $UB0_N$), M number of circuits UA1 (circuits $UA1_1$ to $UA1_M$), N number of circuits UB1 (circuits $UB1_1$ to $UB1_N$), M number of circuits DA0 (circuits $DA0_1$ to $DA0_M$), N number of circuits DB0 (circuits $DB0_1$ to $DB0_N$), M number of circuits DA1 (circuits $DA1_1$ to $DA1_M$), and N number of circuits DB1 (circuits $DB1_1$ to $DB1_N$). Here, "M" is greater than "N". It is to be noted that this is non-limiting, and, "M" may alternatively be less than "N", for example.

Each of the circuits $UA0_1$ to $UA0_M$, $UB0_1$ to $UB0_N$, $UA1_1$ to $UA1_M$, and $UB1_1$ to $UB1_N$ includes a transistor 91 and a resister 92. In this example, the transistor 91 is an N channel MOS (Metal Oxide Semiconductor) type FET (Field Effect Transistor). In each of the circuits $UA0_1$ to $UA0_M$, a gate of the transistor 91 is supplied with the signal UPAA0, a drain thereof is supplied with a voltage V1, and a source thereof is coupled to one end of the resistor 92. In each of the circuit $UB0_1$ to $UB0_N$, a gate of the transistor 91 is supplied with the signal UPAB0, a drain thereof is supplied with a voltage V1, and a source thereof is coupled to one end of the resistor 92. In each of the circuits $UA1_1$ to $UA1_M$, a gate of the transistor 91 is supplied with the signal UPAA1, a drain thereof is supplied with a voltage V1, and a source thereof is coupled to one end of the resistor 92. In each of the circuits $UB1_1$ to $UB1_N$, a gate of the transistor 91 is supplied with the signal UPAB1, a drain thereof is supplied with a voltage V1, and a source thereof is coupled to one end of the resistor 92. In each of the circuits $UA0_1$ to $UA0_M$, $UB0_1$ to $UB0_N$, $UA1_1$ to $UA1_M$, and $UB1_1$ to $UB1_N$, one end of the resistor 92 is coupled to the source of the transistor 91, and the other end thereof is coupled to an output terminal ToutA. A sum of a resistance value in an ON state of the transistor 91 and a resistance value of the resistor 92 is "50×(2×M+2×N)" [Ω], in this example.

Each of the circuits $DA0_1$ to $DA0_M$, $DB0_1$ to $DB0_N$, $DA1_1$ To $Da1_M$, and $DB1_1$ to $DB1_N$ includes a resistor 93 and a transistor 94. In each of the circuits $DA0_1$ to $DA0_M$, $DB0_1$ to $DB0_N$, $DA1_1$ to $DA1_M$, and $DB1_1$ to $DB1_N$, one end of the resistor 93 is coupled to the output terminal ToutA, and the other end thereof is coupled to a drain of the transistor 94. The transistor 94 is an N channel MOS type FET, in this example. In each of the circuits $DA0_1$ to $DA0_M$, a gate of the transistor 94 is supplied with the signal DNAA0, a drain thereof is coupled to the other end of the resistor 93, and a source thereof is grounded. In each of the circuits $DB0_1$ to $DB0_N$, a gate of the transistor 94 is supplied with the signal DNAB0, a drain thereof is coupled to the other end of the resistor 93, and a source thereof is grounded. In each of the circuits $DA1_1$ to $DA1_M$, a gate of the transistor 94 is supplied with the signal DNAA1, a drain thereof is coupled to the other end of the resistor 93, and a source thereof is grounded. In each of the circuits $DB1_1$ to $DB1_N$, a gate of the transistor 94 is supplied with the signal DNAB1, a drain thereof is coupled to the other end of the resistor 93, and a source thereof is grounded. A sum of a resistance value of the resistor 93 and a resistance value in an ON state of the transistor 94 is "50×(2×M+2×N)" [Ω], in this example.

FIG. 9 illustrates an operation example of the emphasis controller 28A. FIGS. 10A to 10C each illustrate an operation example of the driver section 29A when the signal SIGA is set to a voltage state SH. FIGS. 11A to 11C each illustrate an operation example of the driver section 29A when the signal SIGA is set to a voltage state SM. FIGS. 12A to 12C each illustrate an operation example of the driver section 29A when the signal SIGA is set to a voltage state SL. In FIGS. 10A to 10C, 11A to 11C, and 12A to 12C, among the circuits $UA0_1$ to $UA0_M$, $UB0_1$ to $UB0_N$, $UA1_1$ to $UA1_M$, and $UB1_1$ to $UB1_N$, circuits each indicated by a solid line indicate that the transistor 91 is being turned ON, and circuits each indicated by a broken line indicate that the transistor 91 is being turned OFF. Similarly, among the circuits $DA0_1$ to $DA0_M$, $DB0_1$ to $DB0_N$, $DA1_1$ to $DA1_M$, and $DB1_1$ to $DB1_N$, circuits each indicated by a solid line indicate that the transistor 94 is being turned ON, and circuits each indicated by a broken line indicate that the transistor 94 is being turned OFF. It is to be noted that description is given here using the emphasis controller 28A and the driver section 29A as examples. However, the same also applies to the emphasis controller 28B and the driver section 29B, and the emphasis controller 28C and the driver section 29C.

In a case where both the signals MAINAN and SUBAN relating to the current symbol NS are "0" or "1", as illustrated in FIGS. 11A to 11C, the emphasis controller 28A sets the voltage of the signal SIGA to any of three intermediate level voltages VM0, VM1plus, and VM1minus.

Specifically, as illustrated in FIG. 9, for example, in a case where the signals MAINAD and SUBAD relating to the symbol DS that is earlier by one symbol are "0" and "0", and the signals MAINAN and SUBAN relating to the current symbol NS are "0" and "0", the emphasis controller 28A sets the signals UPAA0, UPAB0, UPAA1, UPAB1, DNAA0, DNAB0, DNAA1, and DNAB1 to "11001100". This causes the transistors 91 in the circuits $UA0_1$ to $UA0_M$ and $UB0_1$ to $UB0_N$ to be turned ON and the transistors 94 in the circuits $DA0_1$ to $DA0_M$ and $DB0_1$ to $DB0_N$ to be turned ON, in the driver section 29A, as illustrated in FIG. 11B. As a result, the voltage of the signal SIGA becomes the intermediate level voltage VM0, and an output terminating resistor (output impedance) of the driver section 29A becomes about 50 [Ω]. The same also applies to the case where the signals MAINAD and SUBAD relating to the symbol DS that is earlier by one symbol are "1" and "1" and the signals MAINAN and SUBAN relating to the current symbol NS is "0" and "0". Further, the same also applies to the case where the signals MAINAD and SUBAD relating to the symbol DS that is earlier by one symbol are "0" and "0" and the signals MAINAN and SUBAN relating to the current symbol NS are "1" and "1". Further, the same also applies to the case where the signals MAINAD and SUBAD relating to the symbol DS that is earlier by one symbol are "1" and "1" and the signals MAINAN and SUBAN relating to the current symbol NS are "1" and "1".

Further, in a case where the signals MAINAD and SUBAD relating to the symbol DS that is earlier by one symbol are "0" and "1" and the signals MAINAN and SUBAN relating to the current symbol NS are "0" and "0", for example, the emphasis controller 28A sets the signals UPAA0, UPAB0, UPAA1, UPAB1, DNAA0, DNAB0, DNAA1, and DNAB1 to "11011000". This causes the transistors 91 in the circuits $UA0_1$ to $UA0_M$, $UB0_1$ to $UB0_N$, and $UB1_1$ to $UB1_N$ to be turned ON and the transistors 94 in the circuits $DA0_1$ to $DA0_M$ to be turned ON in the driver section 29A, as illustrated in FIG. 11A. As a result, the voltage of the signal SIGA becomes the intermediate level voltage VM1plus, and the output terminating resistor (output impedance) of the driver section 29A becomes about 50 [Ω]. The same applies to the case where the signals MAINAD and SUBAD relating to the symbol DS that is earlier by one symbol are "0" and "1" and the signals MAINAN and SUBAN relating to the current symbol NS are "1" and "1".

Further, in a case where the signals MAINAD and SUBAD relating to the symbol DS that is earlier by one symbol are "1" and "0" and the signals MAINAN and SUBAN relating to the current symbol NS are "0" and "0", for example, the emphasis controller 28A sets the signals UPAA0, UPAB0, UPAA1, UPAB1, DNAA0, DNAB0, DNAA1, and DNAB1 to "10001101". This causes the transistors 91 in the circuits $UA0_1$ to $UA0_M$ to be turned ON and the transistors 94 in the circuits $DA0_1$ to $DA0_M$, $DB0_1$ to $DB0_N$, and $DB1_1$ to $DB1_N$ to be turned ON, in the driver section 29A, as illustrated in FIG. 11C. As a result, the voltage of the signal SIGA becomes the intermediate level voltage VM1minus, and the output terminating resistor (output impedance) of the driver section 29A becomes about 50 [Ω]. The same applies to the case where the signals MAINAD and SUBAD relating to the symbol DS that is earlier by one symbol are "1" and "0" and the signals MAINAN and SUBAN relating to the current symbol NS are "1" and "1".

Further, in a case where the signals MAINAN and SUBAN relating to the current symbol NS are "0" and "1", the emphasis controller 28A sets the voltage of the signal SIGA to any of the three low level voltages VL0, VL1, and VL2, as illustrated in FIGS. 12A to 12C.

Specifically, in a case where the signals MAINAD and SUBAD relating to the symbol DS that is earlier by one symbol are "1" and "0" and the signals MAINAN and SUBAN relating to the current symbol NS are "0" and "1", for example, the emphasis controller 28A sets the signals UPAA0, UPAB0, UPAA1, UPAB1, DNAA0, DNAB0, DNAA1, and DNAB1 to "00001111". This causes the transistors 94 in the circuits $DA0_1$ to $DA0_M$, $DB0_1$ to $DB0_N$, $DA1_1$ to $DA1_M$, and $DB1_1$ to $DB1_N$ to be turned ON, in the driver section 29A, as illustrated in FIG. 12C. As a result, the voltage of the signal SIGA becomes the low level voltage VL2, and the output terminating resistor (output impedance) of the driver section 29A becomes about 50 [Ω].

Further, in a case where the signals MAINAD and SUBAD relating to the symbol DS that is earlier by one symbol are "0" and "0" and the signals MAINAN and SUBAN relating to the current symbol NS are "0" and "1", for example, the emphasis controller 28A sets the signals UPAA0, UPAB0, UPAA1, UPAB1, DNAA0, DNAB0, DNAA1, and DNAB1 to "01001110". This causes the transistors 91 in the circuits $UB0_1$ to $UB0_N$ to be turned ON and the transistors 94 in the circuits $DA0_1$ to $DA0_M$, $DB0_1$ to $DB0_N$, and $DA1_1$ to $DA1_M$ to be turned ON, in the driver section 29A, as illustrated in FIG. 12B. As a result, the voltage of the signal SIGA becomes the low level voltage VL1, and the output terminating resistor (output impedance) of the driver section 29A becomes about 50 [Ω]. The same applies to the case where the signals MAINAD and SUBAD relating to the symbol DS that is earlier by one symbol are "1" and "1" and the signals MAINAN and SUBAN relating to the current symbol NS are "0" and "1".

Further, in a case where the signals MAINAD and SUBAD relating to the symbol DS that is earlier by one symbol are "0" and "1" and the signals MAINAN and SUBAN relating to the current symbol NS are "0" and "1", for example, the emphasis controller 28A sets the signals UPAA0, UPAB0, UPAA1, UPAB1, DNAA0, DNAB0, DNAA1, and DNAB1 to "01011010". This causes the transistors 91 in the circuits $UB0_1$ to $UB0_N$ and $UB1_1$ to $UB1_N$ to be turned ON and the transistors 94 in the circuits $DA0_1$ to $DA0_M$ and $DA1i$ to $DA1_M$ to be turned ON, in the driver section 29A, as illustrated in FIG. 12B. As a result, the voltage of the signal SIGA becomes the low level voltage VL0, and the output terminating resistor (output impedance) of the driver section 29A becomes about 50 [Ω].

Further, in a case where the signals MAINAN and SUBAN relating to the current symbol NS are "1" and "0", the emphasis controller 28A sets the voltage of the signal SIGA to any of the three high level voltages VH0, VH1, and VH2, as illustrated in FIGS. 10A to 10C.

Specifically, in a case where the signals MAINAD and SUBAD relating to the symbol DS that is earlier by one symbol are "0" and "1" and the signals MAINAN and SUBAN relating to the current symbol NS are "1" and "0", for example, the emphasis controller 28A sets the signals UPAA0, UPAB0, UPAA1, UPAB1, DNAA0, DNAB0, DNAA1, and DNAB1 to "11110000". This causes the transistors 91 in the circuits $UA0_1$ to $UA0_M$, $UB0_1$ to $UB0_N$, $UA1_1$ to $UA1_M$, and $UB1_1$ to $UB1_N$ to be turned ON in the driver section 29A, as illustrated in FIG. 10A. As a result, the voltage of the signal SIGA becomes the high level voltage VH2, and the output terminating resistor (output impedance) of the driver section 29A becomes about 50 [Ω].

Further, in a case where the signals MAINAD and SUBAD relating to the symbol DS that is earlier by one symbol are "0" and "0" and the signals MAINAN and SUBAN relating to the current symbol NS are "1" and "0", for example, the emphasis controller 28A sets the signals UPAA0, UPAB0, UPAA1, UPAB1, DNAA0, DNAB0, DNAA1, and DNAB1 to "10110001". This causes the transistors 91 in the circuits $UA0_1$ to $UA0_M$, $UA1_1$ to $UA1_M$, and $UB1_1$ to $UB1_N$ to be turned ON and the transistors 94 in the circuits $DB1_1$ to $DB1_N$ to be turned ON, in the driver section 29A, as illustrated in FIG. 10B. As a result, the voltage of the signal SIGA becomes the high level voltage VH1, and the output terminating resistor (output impedance) of the driver section 29A becomes about 50 [Ω]. The same applies to the case where the signals MAINAD and SUBAD relating to the symbol DS that is earlier by one symbol are "1" and "1" and the signals MAINAN and SUBAN relating to the current symbol NS are "1" and "0".

Further, in a case where the signals MAINAD and SUBAD relating to the symbol DS that is earlier by one symbol are "1" and "0" and the signals MAINAN and SUBAN relating to the current symbol NS are "1" and "0", for example, the emphasis controller 28A sets the signals UPAA0, UPAB0, UPAA1, UPAB1, DNAA0, DNAB0, DNAA1, and DNAB1 to "10100101". This causes the transistors 91 in the circuits $UA0_1$ to $UA0_M$ and $UA1_1$ to $UA1_M$ to be turned ON and the transistors 94 in the circuits $DB0_1$ to $DB0_N$ and $DB1_1$ to $DB1_N$ to be turned ON, in the driver section 29A, as illustrated in FIG. 10C. As a result, the voltage of the signal SIGA becomes the high level voltage VH0, and the output terminating resistor (output impedance) of the driver section 29A becomes about 50 [Ω].

In this way, the output section 26 sets the voltage states at the output terminals ToutA, ToutB, and ToutC on the basis of the current symbol NS, and sets the voltage level at each voltage state on the basis of the current symbol NS and the symbol DS that is earlier by one symbol. At this time, the transmission device 10 operates as a so-called 2-tap FIR (Finite Impulse Response) filter and performs de-emphasis operation. This allows the communication system 1 to improve communication performance.

(Reception Device 30)

As illustrated in FIG. 1, the reception device 30 includes a receiver 40 and a processor 32.

The receiver 40 receives the signals SIGA, SIGB, and SIGC, and generates transition signals RxF, RxR, and RxP and a clock signal RxCK on the basis of the signals SIGA, SIGB, and SIGC.

FIG. 13 illustrates a configuration example of the receiver 40. The receiver 40 includes resistors 41A, 41B, and 41C, switches 42A, 42B, and 42C, amplifiers 43A, 43B, and 43C, a clock generator 44, flip-flops 45 and 46, and a signal generator 47.

The resistors 41A, 41B, and 41C each serve as a terminating resistor of the communication system 1. In this example, the resistance value is about 50 [Ω]. One end of the resistor 41A is coupled to the input terminal TinA and is supplied with the signal SIGA. The other end of the resistor 41A is coupled to one end of the switch 42A. One end of the resistor 41B is coupled to the input terminal TinB and is supplied with the signal SIGB. The other end of the resistor 41B is coupled to the switch 42B. One end of the resistor 41C is coupled to the input terminal TinC and is supplied with the signal SIGC, and the other end of the resistor 41C is coupled to one end of the switch 42C.

One end of the switch 42A is coupled to the other end of the resistor 41A, and the other end of the switch 42A is coupled to the other ends of the switches 42B and 42C. One end of the switch 42B is coupled to the other end of the resistor 41B, and the other end of the switch 42B is coupled to the other ends of the switches 42A and 42C. One end of the switch 42C is coupled to the other end of the resistor 41C, and the other end of the switch 42C is coupled to the other ends of the switches 42A and 42B. In the reception device 30, switches 42A, 42B, and 42C each are set to the ON state, and the resistors 41A to 41C each serve as a terminating resistor.

A positive input terminal of the amplifier 43A is coupled to a negative input terminal of the amplifier 43C and one end of the resistor 41A, and is supplied with the signal SIGA. A negative input terminal of the amplifier 43A is coupled to a positive input terminal of the amplifier 43B and one end of the resistor 41B, and is supplied with signal SIGB. The positive input terminal of the amplifier 43B is coupled to the negative input terminal of the amplifier 43A and the one end of the resistor 41B, and is supplied with the signal SIGB. A negative input terminal of the amplifier 43B is coupled to a positive input terminal of the amplifier 43C and one end of the resistor 41C, and is supplied with the signal SIGC. The positive input terminal of the amplifier 43C is coupled to the negative input terminal of the amplifier 43B and the one end of the resistor 41C, and is supplied with the signal SIGC. The negative input terminal of the amplifier 43C is coupled to the positive input terminal of the amplifier 43A and the resistor 41A, and is supplied with the signal SIGA.

This configuration allows the amplifier 43A to output a signal that is based on a difference AB (SIGA-SIGB) between the signal SIGA and the signal SIGB, allows the amplifier 43B to output a signal that is based on a difference BC (SIGB-SIGC) between the signal SIGB and the signal SIGC, and allows the amplifier 43C to output a signal that is based on a difference CA (SIGC-SIGA) between the signal SIGC and the signal SIGA.

FIG. 14 illustrates an operation example of the amplifiers 43A, 43B, and 43C in a case where the receiver 40 receives a symbol "+x". It is to be noted that the switches 42A, 42B, and 42C each are in the ON state, and thus the illustrations thereof are omitted. In this example, the voltage state of the signal SIGA is the voltage state SH, the voltage state of the signal SIGB is the voltage state SL, and the voltage state of the signal SIGC is the voltage state SM. In this case, an electric current Iin flows in the input terminal TinA, the resistor 41A, the resistor 41B, and the input terminal TinB in this order. Further, a voltage corresponding to the voltage state SH is supplied to the positive input terminal of the amplifier 43A, and a voltage corresponding to the voltage state SL is supplied to the negative input terminal of the amplifier 43A, thereby the difference AB becomes positive (AB>0). Therefore, the amplifier 32A outputs "1". Further, a voltage corresponding to the voltage state SL is supplied to the positive input terminal of the amplifier 43B, and a voltage corresponding to the voltage state SM is supplied to the negative input terminal of the amplifier 43B, thereby the difference BC becomes negative (BC<0). Therefore, the amplifier 43B output "0". Further, a voltage corresponding to the voltage state SM is supplied to the positive input terminal of the amplifier 43C, and a voltage corresponding to the voltage state SH is supplied to the negative input terminal of the amplifier 43C, thereby the difference CA becomes negative (CA<0). Therefore, the amplifier 43C outputs "0".

The clock generator 44 generates the clock signal RxCK on the basis of the output signal from each of the amplifiers 43A, 43B, and 43C.

The flip-flop 45 delays the output signal from each of the amplifiers 43A, 43B, and 43C by one clock period behind the clock signal RxCK, and outputs each delayed output signal. The flip-flop 46 delays each of the three output signals from the flip-flop 45 by one clock period behind the clock signal RxCK, and outputs each delayed output signal.

The signal generator 47 generates the transition signals RxF, RxR, and RxP on the basis of the output signal from each of the flip-flops 45 and 46 and the clock signal RxCK. The transition signals RxF, RxR, and RxP respectively correspond to the transition signals TxF9, TxR9, and TxP9 in the transmission device 10 (FIG. 5), and each represent the transition of the symbol. The signal generator 47 identifies the transition of the symbol (FIG. 4) on the basis of the symbol indicated by the output signal from the flip-flop 45 and the symbol indicated by the output signal from the flip-flop 46, and generates the transition signals RxF, RxR, and RxP.

The processor 32 (FIG. 1) performs predetermined processing on the basis of the transition signals RxF, RxR, and RxP and the clock signal RxCK.

Here, the driver sections 29A, 29B, and 29C each correspond to a specific example of "driver section" in the disclosure. The signals SIGA, SIGB, and SIGC each correspond to a specific example of "data signal" in the disclosure. The driver controllers 27N and 27D and the emphasis controllers 28A, 28B, and 20C each correspond to a specific example of "control section" in the disclosure. The transmission symbol generator 22 corresponds to a specific example of "signal generation section" in the disclosure. Each of the circuits $UA0_1$ to $UA0_M$, $UB0_1$ to $UB0_N$, $UA1_1$ to $UA1_M$, and $UB1_1$ to $UB1_N$ corresponds to a specific example of "first sub-circuit" in the disclosure. Each of the circuits $DA0_1$ to $DA0_M$, $DB0_1$ to $DB0_N$, $DA1_1$ to $DA1_M$, and $DB1_1$ to $DB1_N$ corresponds to a specific example of "second sub-circuit" in the disclosure.

Workings and Effects

Next, workings and effects of the communication system 1 according to the present embodiment are described.
(Overview of Overall Operation)

First, an overview of an overall operation of the communication system 1 is described with reference to FIGS. 1, 5, and 7. The clock generator 11 in the transmission device 10 generates the clock signal TxCK. The processor 12 performs the predetermined processing to thereby generate the transition signals TxF0 to TxF6, TxR0 to TxR6, and TxP0 to TxP6. In the transmitter 20 (FIG. 5), the serializer 21F generates the transition signal TxF9 on the basis of the transition signals TxF0 to TxF6 and the clock signal TxCK. The serializer 21R generates the transition signal TxR9 on the basis of the transition signals TxR0 to TxR6 and the clock signal TxCK. The serializer 21P generates the transition signal TxP9 on the basis of the transition signals TxP0 to TxP6 and the clock signal TxCK. The transmission symbol generator 22 generates the symbol signals Tx1, Tx2, and Tx3 relating to the current symbol NS and the symbol signals D1, D2, and D3 relating to the symbol DS that is earlier by one symbol, on the basis of the transition signals TxF9, TxR9, and TxP9 and the clock signal TxCK.

In the output section 26 (FIG. 7), the driver controller 27N generates the signals MAINAN, SUBAN, MAINBN, SUBBN, MAINCN, and SUBCN on the basis of the symbol signals Tx1, Tx2, and Tx3 relating to the current symbol NS and the clock signal TxCK. The driver controller 27D generates the signals MAINAD, SUBAD, MAINBD, SUBBD, MAINCD, and SUBCD on the basis of the symbol signals D1, D2, and D3 relating to the symbol DS that is earlier by one symbol, and the clock signal TxCK. The emphasis controller 28A generates the signals UPAA0, UPAB0, UPAA1, UPAB1, DNAA0, DNAB0, DNAA1, and DNAB1 on the basis of the signals MAINAN, SUBAN, MAINAD, and SUBAD. The emphasis controller 28B generates the signals UPBA0, UPBB0, UPBA1, UPBB1, DNBA0, DNBB0, DNBA1, and DNBB1 on the basis of the signals MAINBN, SUBBN, MAINBD, and SUBBD. The emphasis controller 28C generates the signals UPCA0, UPCB0, UPCA1, UPCB1, DNCA0, DNCB0, DNCA1, and DNCB1 on the basis of the signals MAINCN, SUBCN, MAINCD, and SUBCD. The driver section 29A generates the signal SIGA on the basis of the signals UPAA0, UPAB0, UPAA1, UPAB1, DNAA0, DNAB0, DNAA1, and DNAB1. The driver section 29B generates the signal SIGB on the basis of the signals UPBA0, UPBB0, UPBA1, UPBB1, DNBA0, DNBB0, DNBA1, and DNBB1. The driver section 29C generates the signal SIGC on the basis of the signals UPCA0, UPCB0, UPCA1, UPCB1, DNCA0, DNCB0, DNCA1, and DNCB1.

In the reception device 30 (FIG. 1), the receiver 40 receives the signals SIGA, SIGB, and SIGC, and generates the transition signals RxF, RxR, and RxP and the clock signal RxCK on the basis of the signals SIGA, SIGB, and SIGC. The processor 32 performs the predetermined processing on the basis of the transition signals RxF, RxR, and RxP and the clock signal RxCK.

(Detailed Operation)

Next, description is given in detail of an operation of the transmission device 10. In transmission device 10, the output section 26 sets a voltage state in each of the output terminals ToutA, ToutB, and ToutC on the basis of the current symbol NS, and sets voltage levels in each of the voltage states on the basis of the current symbol NS and the symbol DS that is earlier by one symbol.

FIG. 15A illustrates a voltage change of the signal SIGA in a case where the voltage state of the signal SIGA makes a transition from the voltage state SH to another voltage state. It is to be noted that the same applies to the signals SIGB and SIGC. In FIG. 15A, 1UI (Unit Interval) is a period of transmitting one symbol. Further, $\Delta V$ is a difference between the high level voltage VH0 and the intermediate level voltage VM0, and similarly, a difference between the intermediate level voltage VM0 and the low level voltage VL0. The high level voltage VH0, the intermediate level voltage VM0, and the low level voltage VL0 each are a voltage as a basis for a de-emphasis operation.

In a case where the voltage state of the signal SIGA makes a transition from the voltage state SH to the voltage state SM, the voltage of the signal SIGA changes from any of the three high level voltages VH (VH0, VH1, and VH2) to the intermediate level voltage VM1minus. Specifically, in this case, the voltage state in the symbol DS that is earlier by one symbol is the voltage state SH, and thus the signals MAINAD and SUBAD are "1" and "0". The voltage state in the current symbol NS is the voltage state SM, and thus the signals MAINAN and SUBAN are, for example, "0" and "0". Accordingly, as illustrated in FIG. 9, the driver section 29A sets the voltage of the signal SIGA to the intermediate level voltage VM1minus on the basis of the signal supplied from the emphasis controller 28A. In other words, in this case, the transition amount of the signal SIGA is about $(-\Delta V)$, and thus, the emphasis controller 28A sets the voltage of the signal SIGA after the transition to the intermediate level voltage VM1minus, which is lower by one step than the intermediate level voltage VM0 as a basis.

Further, in a case where the voltage state of the signal SIGA makes a transition from the voltage state SH to the voltage state SL, the voltage of the signal SIGA changes from any of the three high level voltages VH (VH0, VH1, and VH2) to the low level voltage VL2. Specifically, in this case, the voltage state in the symbol DS that is earlier by one symbol is the voltage state SH, and thus the signals MAINAD and SUBAD are "1" and "0". The voltage state in the current symbol NS is the voltage state SL, and thus the signals MAINAN and SUBAN are "0" and "1". Accordingly, as illustrated in FIG. 9, the driver section 29A sets the voltage of the signal SIGA to the low level voltage VL2 on the basis of the signal supplied from the emphasis controller 28A. In other words, in this case, the transition amount of the signal SIGA is about $(-2\Delta V)$, and thus, the emphasis controller 28A sets the voltage of the signal SIGA after the transition to the low level voltage VL2, which is lower by two steps than the low level voltage VL0 as a basis.

It is to be noted that, in a case where the voltage state of the signal SIGA is maintained in the voltage state SH, the voltage of the signal SIGA changes from any of the three high level voltages VH (VH0, VH1, and VH2) to the high level voltage VH0. Specifically, in this case, the voltage state in the symbol DS that is earlier by one symbol is the voltage state SH, and thus the signals MAINAD and SUBAD are "1" and "0". The voltage state in the current symbol NS is the voltage state SH, and thus the signals MAINAN and SUBAN are "1" and "0". Accordingly, as illustrated in FIG. 9, the driver section 29A sets the voltage of the signal SIGA to the high level voltage VH0 on the basis of the signal supplied from the emphasis controller 28A. In this way, in a case where the voltage state of the signal SIGA is maintained in the voltage state SH over a plurality of unit intervals in the transmission device 10, the voltage of the signal SIGA is set to the high level voltage VH0 in the second and following unit intervals. In other words, the high level voltage VH0 is a de-emphasized voltage.

FIG. 15B illustrates a voltage change of the signal SIGA in a case where the voltage state of the signal SIGA makes a transition from the voltage state SM to another voltage state.

In a case where the voltage state of the signal SIGA makes a transition from the voltage state SM to the voltage state SH, the voltage of the signal SIGA changes from any of the three intermediate level voltages VM (VM0, VM1plus, and VM1minus) to the high level voltage VH1. Specifically, in this case, the voltage state in the symbol DS that is earlier by one symbol is the voltage state SM, and thus the signals MAINAD and SUBAD are "0" and "0". The voltage state in the current symbol NS is the voltage state SH, and thus the signals MAINAN and SUBAN are "1" and "0". Accordingly, as illustrated in FIG. 9, the driver section 29A sets the voltage of the signal SIGA to the high level voltage VH1 on the basis of the signal supplied from the emphasis controller 28A. In other words, in this case, the transition amount of the signal SIGA is about $(+\Delta V)$, and thus the emphasis controller 28A sets the voltage of the signal SIGA after the transition to the high level voltage VH1, which is higher by one step than the high level voltage VH0 as a basis.

Further, in a case where the voltage state of the signal SIGA makes a transition from the voltage state SM to the voltage state SL, the voltage of the signal SIGA changes from any of the three intermediate level voltages VM (VM0, VM1plus, and VM1minus) to the low level voltage VL1. Specifically, in this case, the voltage state in the symbol DS that is earlier by one symbol is the voltage state SM, and thus the signals MAINAD and SUBAD are "0" and "0". The voltage state in the current symbol NS is the voltage state SL, and thus the signals MAINAN and SUBAN are "0" and "1". Accordingly, as illustrated in FIG. 9, the driver section 29A sets the voltage of the signal SIGA to the low level voltage VL1 on the basis of the signal supplied from the emphasis controller 28A. In other words, in this case, the transition amount of the signal SIGA is about $(-\Delta V)$, and thus the emphasis controller 28A sets the voltage of the signal SIGA after the transition to the low level voltage VL1, which is lower by one step than the low level voltage VL0 as a basis.

It is to be noted that, in a case where the voltage state of the signal SIGA is maintained in the voltage state SM, the voltage of the signal SIGA changes from any of the three intermediate level voltages VM (VM0, VM1plus, and VM1minus) to the intermediate level voltage VM0. Specifically, in this case, the voltage state in the symbol DS that is earlier by one symbol is the voltage state SM, and thus the signals MAINAD and SUBAD are "0" and "0". The voltage state in the current symbol NS is the voltage state SM, and thus the signals MAINAN and SUBAN are "0" and "0". Accordingly, as illustrated in FIG. 9, the driver section 29A sets the voltage of the signal SIGA to the intermediate level voltage VM0 on the basis of the signal supplied from the emphasis controller 28A. In this way, in a case where the voltage state of the signal SIGA is maintained in the voltage state SM over a plurality of unit intervals in the transmission device 10, the voltage of the signal SIGA is set to the intermediate level voltage VM0 in the second and following unit intervals.

FIG. 15C illustrates a voltage change of the signal SIGA in a case where the voltage state of the signal SIGA makes a transition from the voltage state SL to another voltage state.

In a case where the voltage state of the signal SIGA makes a transition from the voltage state SL to the voltage state SM, the voltage of the signal SIGA changes from any of the three low level voltages VL (VL0, VL1, and VL2) to the intermediate level voltage VM1plus. Specifically, in this case, the voltage state in the symbol DS that is earlier by one symbol is the voltage state SL, and thus the signals MAINAD and SUBAD are "0" and "1". The voltage state in the current symbol NS is the voltage state SM, and thus the signals MAINAN and SUBAN are "0" and "0". Accordingly, as illustrated in FIG. 9, the driver section 29A sets the voltage of the signal SIGA to the intermediate level voltage VM1plus on the basis of the signal supplied from the emphasis controller 28A. In other words, in this case, the transition amount of the signal SIGA is about (+ΔV), and thus the emphasis controller 28A sets the voltage of the signal SIGA after the transition to the intermediate voltage VM1plus, which is higher by one step than the intermediate level voltage VM0 as a basis.

Further, in a case where the voltage state of the signal SIGA makes a transition from the voltage state SL to the voltage state SH, the voltage of the signal SIGA changes from any of the three low level voltages VL (VL0, VL1, and VL2) to the high level voltage VH2. Specifically, in this case, the voltage state in the symbol DS that is earlier by one symbol is the voltage state SL, and thus the signals MAINAD and SUBAD are "0" and "1". The voltage state in the current symbol NS is the voltage state SH, and thus the signals MAINAN and SUBAN are "1" and "0". Accordingly, as illustrated in FIG. 9, the driver section 29A sets the voltage of the signal SIGA to the high level voltage VH2 on the basis of the signal supplied from the emphasis controller 28A. In other words, in this case, the transition amount of the signal SIGA is about (+24V), and thus the emphasis controller 28A sets the voltage of the signal SIGA after the transition to the high level voltage VH2, which is higher by two steps than the high level voltage VH0 as a basis.

It is to be noted that, in a case where the voltage state of the signal SIGA is maintained in the voltage state SL, the voltage of the signal SIGA changes from any of the three low level voltages VL (VL0, VL1, and VL2) to the low level voltage VL0. Specifically, in this case, the voltage state in the symbol DS that is earlier by one symbol is the voltage state SL, and thus the signals MAINAD and SUBAD are "0" and "1". The voltage state in the current symbol NS is the voltage state SL, and thus the signals MAINAN and SUBAN are "0" and "1". Accordingly, as illustrated in FIG. 9, the driver section 29A sets the voltage of the signal SIGA to the low level voltage VL0 on the basis of the signal supplied from the emphasis controller 28A. In this way, in a case where the voltage state of the signal SIGA is maintained in the voltage state SL over a plurality of unit intervals in the transmission device 10, the voltage of the signal SIGA is set to the low level voltage VL0 in the second and following unit intervals. In other words, the low level voltage VL0 is a de-emphasized voltage.

In this way, the transmission device 10 sets the voltage after the transition in accordance with the transition amount of the voltage as a result of the transition of the voltage state in each of the signals SIGA, SIGB, and SIGC. Specifically, in a case where the voltage state makes a transition to a higher state by one step, the transmission device 10 sets the voltage after the transition to a higher voltage by one step than the voltage as a basis (for example, the intermediate level voltage VM0 or the high level voltage VH0). In other words, in this case, the transmission device 10 sets a positive emphasis voltage of one step. Further, in a case where the voltage state makes a transition to a higher state by two steps, the transmission device 10 sets the voltage after the transition to a higher voltage by two steps than the voltage as a basis (for example, the high level voltage VH0). In other words, in this case, the transmission device 10 sets a positive emphasis voltage of two steps. Further, in a case where the voltage state makes a transition to a lower state by one step, the transmission device 10 sets the voltage after the transition to a lower voltage by one step than the voltage as a basis (for example, the intermediate level voltage VM0 or the low level voltage VL0). In other words, in this case, the transmission device 10 sets a negative emphasis voltage of one step. Further, in a case where the voltage state makes a transition to a lower state by two steps, the transmission device 10 sets the voltage to a lower voltage by two steps than the voltage as a basis (for example, the low level voltage VL0). In other words, in this case, the transmission device 10 sets a negative emphasis voltage of two steps. In this way, the transmission device 10 sets the emphasis voltage in accordance with the transition amount of the voltage in such a manner that the emphasis voltage is in proportion to the transition amount, in each of the signals SIGA, SIGB, and SIGC.

FIGS. 16A to 16E each illustrate an operation example of the communication system 1 in a case where the symbol makes a transition from "+x" to any of the symbols other than "+x". FIG. 16A illustrates a case where the symbol makes a transition from "+x" to "−x". FIG. 16B illustrates a case where the symbol makes a transition from "+x" to "+y". FIG. 16C illustrates a case where the symbol makes a transition from "+x" to "−y". FIG. 16D illustrates a case where the symbol makes a transition from "+x" to "+z". FIG. 16E illustrates a case where the symbol makes a transition from "+x" to "−z". In each of FIGS. 16A to 16E, (A) illustrates waveforms of the signals SIGA, SIGB, and SIGC at the output terminals ToutA, ToutB, and ToutC, respectively, of the transmission device 10, and (B) illustrates waveforms of differences AB, BC, and CA in the reception device 30. Further, the solid lines each illustrate a waveform at the time of performing a de-emphasis operation, and the broken lines each illustrate a waveform at the time of not performing the de-emphasis operation. Further, a voltage of the signal SIGA before the transition is any of the three high level voltages VH. However, in the drawings, the voltage of the signal SIGA is set to the high level voltage VH0 for convenience of description. Similarly, the voltage of the signal SIGB before the transition is set to the low level voltage VL0, and the voltage of the signal SIGC before the transition is set to the intermediate level voltage VM0.

As illustrated in FIG. 16A(A), in a case where the symbol makes a transition from "+x" and "−x", the signal SIGA changes from the high level voltage VH0 to the low level voltage VL2. The signal SIGB changes from the low level voltage VL0 to the high level voltage VH2. The signal SIGC is maintained in the intermediate level voltage VM0. In other words, the transition amount of the signal SIGA is about (−2ΔV), and thus, the transmission device 10 sets the voltage of the signal SIGA to the low level voltage VL2 that is lower by two steps than the low level voltage VL0 as a basis. Further, the transition amount of the signal SIGB is about (+2ΔV), and thus the transmission device 10 sets the voltage of the signal SIGB to the high level voltage VH2 that is higher by two steps than the high level voltage VH0 as a basis. At this time, as illustrated in FIG. 16A(B), the transmission amount of the difference AB (SIGA-SIGB) is about (−4ΔV), and thus, the difference AB after the transition becomes lower by four steps, as compared with the case of not performing the de-emphasis operation. Further, the transition amount of the difference BC (SIGB-SIGC) is about (+2ΔV), and thus, the difference BC after the transition becomes higher by two steps, as compared with the case of not performing the de-emphasis operation. Further, the transition amount of the difference CA (SIGC-SIGA) is about (+2ΔV), and thus, the difference CA after the transition becomes higher by two steps, as compared with the case of not performing the de-emphasis operation.

As illustrated in FIG. 16B(A), in a case where the symbol makes a transition from "+x" to "+y", the signal SIGA changes from the high level voltage VH0 to the intermediate level voltage VM1minus. The signal SIGB changes from the low level voltage VL0 to the high level voltage VH2. The signal SIGC changes from the intermediate level voltage VM0 to the low level voltage VL1. In other words, the transition amount of the signal SIGA is about (−ΔV), the transmission device 10 sets the voltage of the signal SIGA to the intermediate level voltage VM1minus that is lower by one step than the intermediate level voltage VM0 as a basis. Further, the transition of the signal SIGB is about (+2ΔV), the transmission device 10 sets the voltage of the signal SIGB to the high level voltage VH2 that is higher by two steps than the high level voltage VH0 as a basis. Further, the transition amount of the signal SIGC is about (−ΔV), the transmission device 10 sets the voltage of the signal SIGC to the low level voltage VL1 that is lower by one step than the low level voltage VL0 as a basis. At this time, as illustrated in FIG. 16B(B), the transition amount of the difference AB (SIGA-SIGB) is about (−3ΔV), the difference AB after the transition is lower by three steps, as compared with the case of not performing the de-emphasis operation. Further, the transition amount of the difference BC (SIGB-SIGC) is about (+3ΔV), and thus, the difference BC after the transition is higher by three steps, as compared with the case of not performing the de-emphasis operation.

As illustrated in FIG. 16C(A), in a case where the symbol makes a transition from "+x" to "−y", the signal SIGA changes from the high level voltage VH0 to the intermediate level voltage VM1minus. The signal SIGB is maintained in the low level voltage VL0. The signal SIGC changes from the intermediate level voltage VM0 to the high level voltage VH1. In other words, the transition amount of the signal SIGA is about (−ΔV), and thus, the transmission device 10 sets the voltage of the signal SIGA to the intermediate level voltage VM1minus that is lower by one step than the intermediate level voltage VM0 as a basis. Further, the transition amount of the signal SIGC is about (+ΔV), and thus, the transmission device 10 sets the voltage of the signal SIGC to the high level voltage VH1 that is higher by one step than the high level voltage VH0 as a basis. At this time, as illustrate in FIG. 16C(B), the transition amount of the difference AB (SIGA-SIGB) is about (−ΔV), and thus, the difference AB after the transition becomes lower by one step, as compared with the case of not performing the de-emphasis operation. Further, the transition amount of the difference BC (SIGB-SIGC) is about (−ΔV), and thus, the difference BC after the transition becomes lower by one step, as compared with the case of not performing the de-emphasis operation. Further, the transition amount of the difference CA (SIGC-SIGA) is about (+2ΔV), the difference CA after the transition becomes higher by two steps, as compared with the case of not performing the de-emphasis operation.

As illustrated in FIG. 16D(A), in a case where the symbol makes a transition from "xx" to "+z", the signal SIGA changes from the high level voltage VH0 to the low level voltage VL2. The signal SIGB changes from the low level voltage VL0 to the intermediate level voltage VM1plus. The signal SIGC changes from the intermediate level voltage VM0 to the high level voltage VH1. In other words, the transition amount of the signal SIGA is about (−2ΔV), and thus, the transmission device 10 sets the voltage of the signal SIGA to the low level voltage VL2 that is lower by two steps than the low level voltage VL0 as a basis. Further, the transition amount of the signal SIGB is about (+ΔV), and thus, the transmission device 10 sets the voltage of the signal SIGB to the intermediate level voltage VM1plus that is higher by one step than the intermediate level voltage VM0 as a basis. Further, the transition amount of the signal SIGC is about (+ΔV), and thus, the transmission device 10 sets the voltage of the signal SIGC to the high level voltage VH1 that is higher by one step than the high level voltage VH0 as a basis. At this time, as illustrated in FIG. 16D(B), the transition amount of the difference AB (SIGA-SIGB) is about (−3ΔV), the difference AB after the transition becomes lower by three steps, as compared with the case of not performing the de-emphasis operation. Further, the transition amount of the difference CA (SIGC-SIGA) is about (+3ΔV), the difference CA after the transition becomes higher by three steps, as compared with the case of not performing the de-emphasis operation.

As illustrated in FIG. 16E(A), in a case where the symbol makes a transition from "+x" to "−z", the signal SIGA is maintained in the high level voltage VH0. The signal SIGB changes from the low level voltage VL0 to the intermediate level voltage VM1plus. The signal SIGC changes from the intermediate level voltage VM0 to the low level voltage VL1. In other words, the transition amount of the SIGB is about (+ΔV), and thus, the transmission device 10 sets the voltage of the signal SIGB to the intermediate level voltage VM1plus that is higher by one step than the intermediate level voltage VM0 as a basis. Further, the transition amount of the signal SIGC is about (−ΔV), and thus, the transmission device 10 sets the voltage of the signal SIGC to the low level voltage VL1 that is lower by one step than the low level voltage VL0 as a basis. At this time, as illustrated in FIG. 16E(B), the transition amount of the difference AB (SIGA-SIGB) is about (−ΔV), and thus, the difference AB after the transition becomes lower by one step, as compared with the case of not performing the de-emphasis operation. Further, the transition amount of the difference BC (SIGB-SIGC) is about (+2ΔV), and thus, the difference BC after the transition becomes higher by two steps, as compared with the case of not performing the de-emphasis operation. Further, the transition amount of the difference CA (SIGC-SIGA) is about (−ΔV), the difference CA after the transition becomes lower by one step, as compared with the case of not performing the de-emphasis operation.

In this way, the emphasis voltage is set in accordance with the transition amount of the voltage in each of the signals SIGA, SIGB, and SIGC, in the communication system 1. In other words, the transmission device 10 performs the de-emphasis operation to each of the signals SIGA, SIGB, and SIGC (a single end signal). As a result, in the communication system 1, it is possible to improve waveform quality for each of the signals SIGA, SIGB, and SIGC, and thus, possible to improve communication performance.

Further, in the communication system 1, by setting the emphasis voltage to each of the signals SIGA, SIGB, and SIGC in this way, the emphasis voltage is also set, in accordance with the transition amount of the voltage, to each of the differences AB, BC, and CA each as a differential signal. As a result, in the communication system 1, it is possible to improve the waveform quality of each of the differences AB, BC, and CA, and thus, possible to improve the communication performance.

FIGS. 17A and 17B each illustrate an eye diagram of the difference AB between the signal SIGA and the signal SIGB, the difference BC between the signal SIGB and the signal SIGC, and the difference CA between signal SIGC and the signal SIGA, in a case of having performed the de-emphasis operation. FIGS. 18A and 18B each illustrate an eye diagram of the difference AB between the signal SIGA and the signal SIGB, the difference BC between the signal SIGB and the signal SIGC, and the difference CA between the signal SIGC and the signal SIGA, in a case of not performing the de-emphasis operation. FIGS. 17A and 18A each illustrate an eye diagram at the output terminals ToutA, ToutB, and ToutC of the transmission device 10 in a case where there is no transmission path 100. FIGS. 17B and 18B each illustrate an eye diagram at the input terminals TinA, TinB, and TinC of the reception device 30 in a case where there is a transmission path 100. In the communication system 1, as illustrated in FIGS. 17B and 18B, performing the de-emphasis operation makes it possible to provide a wider eye opening, a result of which it is possible to improve the communication performance.

Comparative Example

Next, description is given of effects of the present embodiment while making a comparison with a comparative example. A communication system 1R according to the comparative example includes a transmission device 10R. The transmission device 10R performs pre-emphasis operation. The transmission device 10R includes two driver sections 29RA that are coupled to the output terminal ToutA, two driver sections 29RB that are coupled to the output terminal ToutB, and two driver sections 29RC that are coupled to the output terminal ToutC. The transmission device 10R, for example, allows the two driver sections 29RA to operate together to set the output impedance to about 25 [Ω], allows the two driver sections 29RB to operate together to set the output impedance to about 25 [Ω], and allows the two driver sections 29RC to operate together to set the output impedance to about 25 [Ω]. The transmission device 10R decreases the output impedance in this way to thereby perform the pre-emphasis operation.

FIGS. 19A to 19E each illustrate an operation example of the communication system 1R in a case where a symbol makes a transition from "+x" to any of the symbols other than "+x". For example, as illustrated in FIG. 19A, in a case where the symbol makes a transition from "+x" to "−x", the signal SIGA changes from the high level voltage VH0 to the low level voltage VL through a lower voltage than the low level voltage VL0. The signal SIGB changes from the low level voltage VL0 to the high level voltage VH through a higher voltage than the high level voltage VH0. The signal SIGC maintains the intermediate level voltage VM0. At this time, in a former-half period (for example, 0.5 UI) in the period in which the transmission device 10R outputs the symbol "−x", the two driver sections 29RA operate together to set the output impedance to about 25 [Ω], the two driver sections 29RB operate together to set the output impedance to about 25 [Ω], and the two driver sections 29RC operate together to set the output impedance to about 25 [Ω]. The same applies to the other symbol transitions illustrated in FIGS. 19B to 19E. It is to be noted that the length of the former-half period is 0.5 UI; however, this is non-limiting. The length may alternatively be longer than 0.5 UI.

In this way, in the communication system 1R according to the comparative example, the output impedance is set to about 25 [Ω] to thereby perform the pre-emphasis operation. This causes a period in which the output impedance does not match the characteristic impedance of the transmission path 100. This may possibly cause the deterioration of waveform quality and thus the deterioration of communication performance in the communication system 1R. Further, in the communication system 1R, the output impedance becomes about 25 [Ω] transiently at the time of outputting the intermediate level voltage VM0, which causes the increase of a direct electric current caused by Thevenin termination, a result of which power consumption relating to the direct electric current increases. Further, the two driver sections 29RA, the two driver sections 29RB, and the two driver sections 29RC are provided in the communication system 1R. This leads to the increase of circuit area.

In contrast, in the communication system 1 according to the present embodiment, the number of the transistors 91 and 94 to be turned ON is changed to thereby perform the de-emphasis operation, and thus, it is possible to maintain the output impedance at about 50 [Ω]. As a result, the output impedance matches the characteristic impedance of the transmission path 100, which makes it possible to improve waveform quality and thus communication performance. Further, in the communication system 1, it is possible to suppress direct electric current caused by Thevenin termination, as compared with the communication system 1R according to the comparative example, which makes it possible to reduce power consumption. Further, in the communication system 1, the driver sections 29A, 29B, and 29C are provided one by one, which makes it possible to reduce circuit area, as compared with the communication system 1R according to the comparative example.

Effects

As described above, in the present embodiment, the emphasis voltage is set in each of the signals SIGA, SIGB, and SIGC, in accordance with the transition amount of the voltage. Therefore, it is possible to improve waveform quality for each of the signals SIGA, SIGB, and SIGC, and thus, it is possible to improve communication performance.

In the present embodiment, the number of the transistors 91 and 94 to be turned ON is changed to thereby set the emphasis voltage while maintaining the output impedance at about 50 [Ω]. This makes it possible to improve communication performance and reduce power consumption.

Modification Example 1

In the above-described embodiment, the output section 26 generates the signals SIGA, SIGB, and SIGC on the basis of the symbol signals Tx1, Tx2, and Tx3, the symbol signals D1, D2, and D3, and the clock signal TxCK; however, this is non-limiting. In the following, description is given in detail of a transmission device 10A according to the present modification example.

FIG. 20 illustrates a configuration example of a transmitter 20A of a transmission device 10A. The transmitter 20A includes a transmission symbol generator 22A, and an output section 26A. The transmission symbol generator 22A generates the symbol signals Tx1, Tx2, and Tx3 on the basis of the transition signals TxF9, TxR9, and TxP9 and the clock signal TxCK. The output section 26A generates the signals SIGA, SIGB, and SIGC on the basis of the symbol signals Tx1, Tx2, and Tx3 and the clock signal TxCK.

FIG. 21 illustrates a configuration example of the output section 26A. The output section 26A includes a driver controller 27N and flip flops 17A, 17B, and 17C. The driver controller 27N generates signals MAINAN, SUBAN, MAINBN, SUBBN, MAINCN, and SUBCN on the basis of the symbol signals Tx1, Tx2, and Tx3 relating to the current symbol NS and the clock signal TxCK. The flip flop 17A delays the signals MAINAN and SUBAN by one clock period behind the clock signal TxCK, to output them as the signals MAINAD and SUBAD, respectively. The flip flop 17B delays the signals MAINBN and SUBBN by one clock period behind the clock signal TxCK, to output them as the signals MAINBD and SUBBD, respectively. The flip flop 17C delays the signals MAINCN and SUBCN by one clock period behind the clock signal TxCK, to output them as the signals MAINCD and SUBCD, respectively.

With such a configuration, it is still possible to achieve effects similarly to the effects of the above-described embodiments.

Modification Example 2

In the above-described embodiment, the transmission device 10 performs the de-emphasis operation; however, this is non-limiting. The transmission device 10 may perform the pre-emphasis operation. FIG. 22 illustrates three voltage states SH, SM, and SL. The voltage state SH is a state that corresponds to three high level voltages VH (VH0, VH1, and VH2). The voltage state SM is a state that corresponds to three intermediate level voltages VM (VM0, VM1plus, and VM1minus). The voltage state SL is a state that corresponds to three low level voltages VL (VL0, VL1, and VL2). The high level voltage VH0 is a high level voltage in a case of not applying pre-emphasis. The intermediate level voltage VM0 is an intermediate level voltage in a case of not applying pre-emphasis. The low level voltage VL0 is a low level voltage in a case of not applying pre-emphasis. With such a configuration, it is still possible to achieve effects similarly to the effects of the above-described embodiments.

Modification Example 3

In the above-described embodiment, the three voltage states SH, SM, and SL are provided for each of the signals SIGA, SIGB, and SIGC; however, this is non-limiting. It is possible to apply the techniques to a communication system that transmits data by using three or more multiple voltage states.

FIG. 23 illustrates the n-number of voltage states $S(1)$ to $S(n)$ used in a communication system according to the present modification example. The voltage states S each correspond to the n-number of voltages. Specifically, for example, the voltage state $S(1)$ corresponds to the n-number of voltages $V(1)_0, V(1)_1, V(1)_2, \ldots,$ and $V(1)_{n-1}$. The voltage state $S(2)$ corresponds to the n-number of voltages $V(2)_{(n-1) \times 0.5 \ minus}, \ldots, V(2)_{1 \ minus}, V(2)_0, V(2)_{1 \ plus}, \ldots,$ and $V(2)_{(n-1) \times 0.5 \ plus}$. The voltage state $S(n-1)$ corresponds to the n-number of voltages $V(n-1)_{(n-1) \times 0.5 \ minus}, \ldots, V(n-1)_{1 \ minus}, V(n-1)_0, V(n-1)_{1 \ plus}, \ldots,$ and $V(n-1)_{(n-1) \times 0.5 \ plus}$. The voltage state $S(n)$ corresponds to the n-number of voltages $V(n)_0, V(n)_1, V(n)_2, \ldots,$ and $V(n)_{n-1}$.

Further, in the above-described embodiment, three signals SIGA, SIGB, and SIGC are used to transmit data; however, this is non-limiting. Data may be transmitted by using no greater than two signals or no less than four signals.

Other Modification Examples

Further, two or more of these modification examples may be combined.

2. Application Example

Description is given next of application examples of the communication systems that have been described in the foregoing embodiments and modification examples.

Application Example 1

FIG. 25 illustrates an appearance of a smartphone 300 (a multi-functional mobile phone) to which the communication system according to any of the foregoing embodiments, etc. is applied. Various devices are mounted in the smartphone 300. The communication system according to any of the foregoing embodiments, etc. is applied to a communication system that exchanges data between these devices.

FIG. 24 illustrates a configuration example of an application processor 310 used in the smartphone 300. The application processor 310 includes a CPU (central processing unit) 311, a memory controller 312, a power supply controller 313, an external interface 314, a GPU (graphics processing unit) 315, a media processor 316, a display controller 317, and an MIPI (mobile industry processor interface) interface 318. In this example, the CPU 311, the memory controller 312, the power supply controller 313, the external interface 314, the GPU 315, the media processor 316, and the display controller 317 are coupled to a system bus 319 to allow for mutual data exchange via the system bus 319.

The CPU 311 processes various pieces of information handled in the smartphone 300 in accordance with a program. The memory controller 312 controls a memory 501 used at a time when the CPU 311 performs information processing. The power supply controller 313 controls a power supply of the smartphone 300.

The external interface 314 is an interface for communication with external devices. In this example, the external interface 314 is coupled to a wireless communication section 502 and an image sensor 410. The wireless communication section 502 performs wireless communication with mobile phone base stations. The wireless communication section 502 includes, for example, a baseband section, an RF (radio frequency) front end section, and other components. The image sensor 410 acquires an image, and includes, for example, a CMOS sensor.

The GPU 315 performs image processing. The media processor 316 processes information such as voice, letters, and graphics. The display controller 317 controls the display 504 via the MIPI interface 318. The MIPI interface 318 transmits an image signal to the display 504. As the image signal, for example, a YUV-format signal, an RGB-format signal, or any other format signal may be used. The MIPI interface 318 operates, on the basis of a reference clock supplied from an oscillator circuit 330 including a crystal resonator, for example. For example, the communication system according to any of the foregoing embodiments, etc. is applied to a communication system between the MIPI interface 318 and the display 504.

FIG. 26 illustrates a configuration example of the image sensor 410. The image sensor 410 includes a sensor section 411, an ISP (image signal processor) 412, a JPEG (joint photographic experts group) encoder 413, a CPU 414, a RAM (random access memory) 415, a ROM (read only memory) 416, a power supply controller 417, an I$^2$C (inter-integrated circuit) interface 418, and an MIPI interface 419. In this example, these blocks are coupled to a system bus 420 to allow for mutual data exchange via the system bus 420.

The sensor section 411 acquires an image, and is configured by, for example, a CMOS sensor. The ISP 412 performs predetermined processing on the image acquired by the sensor section 411. The JPEG encoder 413 encodes the image processed by the ISP 412 to generate a JPEG-format image. The CPU 414 controls respective blocks of the image sensor 410 in accordance with a program. The RAM 415 is a memory used at a time when the CPU 414 performs information processing. The ROM 416 stores a program to be executed in the CPU 414, a setting value obtained by calibration, and any other information. The power supply controller 417 controls a power supply of the image sensor 410. The I$^2$C interface 418 receives a control signal from the application processor 310. Although not illustrated, the image sensor 410 also receives a clock signal from the application processor 310, in addition to the control signal. Specifically, the image sensor 410 is operable on the basis of clock signals of various frequencies. The MIPI interface 419 transmits an image signal to the application processor 310. As the image signal, for example, a YUV-format signal, an RGB-format signal, or any other format signal may be used. The MIPI interface 419 operates on the basis of a reference clock supplied from an oscillator circuit 430 including a crystal resonator, for example. For example, the communication system according to any of the foregoing embodiments, etc. is applied to a communication system between the MIPI interface 419 and the application processor 310.

Application Example 2

FIG. 27 illustrates a configuration example of a vehicle control system 600 to which the communication system according to any of the foregoing embodiments, etc. is applied. The vehicle control system 600 controls operations of an automobile, an electric vehicle, a hybrid electric vehicle, a two-wheeled vehicle, and the like. This vehicle control system 600 includes a driving system control unit 610, a body system control unit 620, a battery control unit 630, an outside-vehicle information detecting unit 640, an in-vehicle information detecting unit 650, and an integrated control unit 660. These units are coupled to one another via a communication network 690. As the communication network 690, for example, a network that complies with any standard such as a CAN (controller area network), LIN (local interconnect network), LAN (local area network), and FlexRay (Registered Trademark) may be used. Each of the units includes, for example, a microcomputer, a storage section, a drive circuit that drives a device to be controlled, a communication I/F, and the like.

The driving system control unit 610 controls operations of devices related to a driving system of a vehicle. A vehicle state detecting section 611 is coupled to the driving system control unit 610. The vehicle state detecting section 611 detects a state of the vehicle. The vehicle state detecting section 611 includes a gyro sensor, an acceleration sensor, a sensor that detects an amount of operation of an accelerator pedal and a brake pedal or a steering angle, or any other sensor, for example. The driving system control unit 610 controls the operations of the devices related to the driving system of the vehicle on the basis of information detected by the vehicle state detecting section 611. For example, the communication system of any of the foregoing embodiments, etc. is applied to a communication system between the driving system control unit 610 and the vehicle state detecting section 611.

The body system control unit 620 controls operations of various devices mounted on the vehicle, such as a keyless entry system, a power window device, and various lamps.

The battery control unit 630 controls a battery 631. The battery 631 is coupled to the battery control unit 630. The battery 631 supplies power to a driving motor, and includes, for example, a secondary battery, a cooling system, and the like. The battery control unit 630 acquires information such as temperature, an output voltage, and a remaining battery amount from the battery 631, and controls the cooling system, etc. of the battery 631 on the basis of the information. For example, the communication system of any of the foregoing embodiments, etc. is applied to a communication system between the battery control unit 630 and the battery 631.

The outside-vehicle information detecting unit 640 detects information outside the vehicle. An imaging section 641 and an outside-vehicle information detecting section 642 are coupled to the outside-vehicle information detecting unit 640. The imaging section 641 captures an image outside the vehicle, and includes, for example, a time of flight (ToF) camera, a stereo camera, a monocular camera, an infrared camera, and the like. The outside-vehicle information detecting section 642 detects information outside the vehicle, and includes, for example, a sensor that detects weather and climate, a sensor that detects other vehicles around the vehicle, an obstacle, a pedestrian, etc., and any other sensor. The outside-vehicle information detecting unit 640 recognizes, for example, weather and climate, a road surface condition, etc. on the basis of the image acquired by the imaging section 641 as well as the information detected by the outside-vehicle information detecting section 642, and detects objects such as other vehicles around the vehicle, an obstacle, a pedestrian, a sign, and letters on a road, or detects a distance between the object and the vehicle. For example, the communication system of any of the foregoing embodiments, etc. is applied to a communication system between the outside-vehicle information detecting unit 640 and each of the imaging section 641 and the outside-vehicle information detecting section 642.

The in-vehicle information detecting unit 650 detects information inside the vehicle. A driver state detecting section 651 is coupled to the in-vehicle information detecting unit 650. The driver state detecting section 651 detects a state of a driver, and includes, for example, a camera, a biosensor, a microphone, and the like. The in-vehicle information detecting unit 650 monitors, for example, a degree of fatigue of the driver or a degree of concentration of the driver, whether the driver is dozing, and any other factor, on the basis of information detected by the driver state detecting section 651. For example, the communication system of any of the foregoing embodiments, etc. is applied to a communication system between the in-vehicle information detecting unit 650 and the driver state detecting section 651.

The integrated control unit 660 controls operations of the vehicle control system 600. An operating section 661, a display section 662, and an instrument panel 663 are coupled to the integrated control unit 660. An occupant operates the operating section 661. The operating section 661 includes, for example, a touch panel, various buttons, switches, and the like. The display section 662 displays an image, and is configured by, for example, a liquid crystal display panel, etc. The instrument panel 663 displays a state of the vehicle, and includes meters such as a speed meter, various warning lamps, and the like. For example, the communication system of any of the foregoing embodiments, etc. is applied to a communication system between the integrated control unit 660 and each of the operating section 661, the display section 662, and the instrument panel 663.

Although the technology has been described above referring to embodiments and modification examples as well as application examples to electronic apparatuses, the technology is not limited to these embodiments, etc., and may be modified in a variety of ways.

For example, the voltage levels in each of the voltage states are set on the basis of the current symbol NS and the symbol DS that is earlier by one symbol, in the above-described embodiments, etc., this is non-limiting. Voltage levels of each of the voltage states may alternatively be set on the basis of, for example, the current symbol NS, the symbol DS that is earlier by one symbol, and a symbol that is earlier by two symbols. In this case, the transmission device operates as a so-called 3-tap FIR filter and performs the de-emphasis operation. It is to be noted that the technique is not limited thereto, and voltage levels of each of the voltage states may be set on the basis of four or more symbols including the current symbol NS.

It is to be noted that effects described herein are merely illustrative and are not limitative, and may have other effects.

It is to be noted that the technology may have the following configurations.

(1)
A transmission device including:
a driver section that is able to transmit a data signal by using three or more predetermined number of voltage states and set voltages in each of the voltage states; and
a control section that sets an emphasis voltage that is based on a transition among the predetermined number of the voltage states, and thereby causes the driver section to perform emphasis.

(2)
The transmission device according to (1), in which
the predetermined number of the voltage states include a first voltage state, a second voltage state, and a third voltage state that is between the first voltage state and the second voltage state, and
the emphasis voltage in a case of making a transition from the first voltage state to the second voltage state is greater than the emphasis voltage in a case of making a transition from the first voltage state to the third voltage state.

(3)
The transmission device according to (2),
in which the driver section includes:
a first driver section that selectively sets a voltage state at a first output terminal to any of the first voltage state, the second voltage state, and the third voltage state;
a second driver section that selectively sets a voltage state at a second output terminal to any of the first voltage state, the second voltage state, and the third voltage state; and
a third driver section that selectively sets a voltage state at a third output terminal to any of the first voltage state, the second voltage state, and the third voltage state, and
in which the voltage states at the first output terminal, the second output terminal, and the third output terminal differ from one another.

(4)
The transmission device according to (3), in which
the data signal indicates a sequence of a symbol, and
the control section sets, in accordance with the sequence of the symbol, the emphasis voltage at each of the first output terminal, the second output terminal, and the third output terminal.

(5)
The transmission device according to (4), further including:
a signal generation section that generates, on the basis of a transition signal indicating symbol transition, a first symbol signal indicating a symbol, and a second symbol signal indicating a symbol that is earlier by one symbol than the symbol indicated by the first symbol signal,
in which the control section sets, on the basis of the first symbol signal and the second symbol signal, the emphasis voltage at each of the first output terminal, the second output terminal, and the third output terminal.

(6)
The transmission device according to (5), in which the first driver section, the second driver section, and the third driver section respectively set, on the basis of the first symbol signal, voltage states at the first output terminal, the second output terminal, and the third output terminal.

(7)
The transmission device according to (4), further including a signal generation section that generates, on the basis of a transition signal indicating symbol transition, a symbol signal indicating a symbol,
in which the control section sets, on the basis of a sequence of the symbol indicated by the symbol signal, the emphasis voltage at each of the first output terminal, the second output terminal, and the third output terminal.

(8)
The transmission device according to any one of (3) to (7), in which
the first driver section includes:
a first circuit that is provided on a path from a first power supply to the first output terminal; and
a second circuit that is provided on a path from a second power supply to the first output terminal, and
the control section sets an impedance ratio of an impedance of the first circuit to an impedance of the second circuit, and thereby sets the emphasis voltage at the first output terminal.

(9)

The transmission device according to (8), in which the control section sets the impedance ratio to cause a parallel impedance of the impedance of the first circuit and the impedance of the second circuit to be constant.

(10)

The transmission device according to (8) or (9), in which
the first circuit includes a plurality of first sub-circuits ach including a first resistor and a first transistor that are provided on the path from the first power supply to the first output terminal,
the second circuit includes a plurality of second sub-circuits each including a second resistor and a second transistor that are provided on the path from the second power supply to the first output terminal, and
the control section sets number of first transistors to be turned ON out of the first transistors that are provided in the first circuit, and sets number of second transistors to be turned ON out of the second transistors that are provided in the second circuit, and thereby sets the emphasis voltage at the first output terminal.

(11)

The transmission device according to (10), in which
the plurality of first sub-circuits are grouped into a plurality of first groups,
the plurality of second sub-circuits are grouped into a plurality of second groups, and
the control section causes the first transistors in the first circuit to turn ON and OFF in a unit of the first group, and causes the second transistors in the second circuit to turn ON and OFF in a unit of the second group, and thereby sets the emphasis voltage at the first output terminal.

(12)

The transmission device according to (11), in which
the plurality of first groups include a first sub-group and a second sub-group, and
number of the first sub-circuits that belong to the first sub-group differs from number of the first sub-circuits that belong to the second sub-group.

(13)

The transmission device according to any one of (1) to (12), in which the voltages in each of the voltage states are able to be set to have same number of voltages as the predetermined number, the voltages differing from one another.

(14)

The transmission device according to any one of (1) to (13), in which the emphasis includes de-emphasis.

(15)

The transmission device according to any one of (1) to (13), in which the emphasis includes pre-emphasis.

(16)

A transmission method including:
transmitting a data signal by using three or more predetermined number of voltage states; and
setting an emphasis voltage that is based on a transition among the predetermined number of the voltage states, and thereby to perform emphasis.

(17)

A communication system provided with a transmission device and a reception device, the transmission device including:
a driver section that is able to transmit a data signal by using three or more predetermined number of voltage states and set voltages in each of the voltage states; and
a control section that sets an emphasis voltage that is based on a transition among the predetermined number of the voltage states, and thereby causes the driver section to perform emphasis.

It should be understood by those skilled in the art that various modifications, combinations, sub-combinations, and alterations may occur depending on design requirements and other factors insofar as they are within the scope of the appended claims or the equivalents thereof.

The invention claimed is:

1. A communication system comprising:
a communication network; and
a transmission device including
a driver section that is able to transmit a data signal by using three or more predetermined number of voltage states and set voltages in each of the voltage states, and
a control section that sets an emphasis voltage that is based on a transition among the predetermined number of the voltage states, and thereby causes the driver section to perform emphasis; and
a reception device including
a reception section that is configured to receive the data signal and the emphasis voltage from the transmission device, and
a communication interface section configured to communicate information to a control device via the communication network, the information based on the data signal and the emphasis voltage.

2. The communication system according to claim 1, wherein
the predetermined number of the voltage states include a first voltage state, a second voltage state, and a third voltage state that is between the first voltage state and the second voltage state, and
the emphasis voltage in a case of making a transition from the first voltage state to the second voltage state is greater than the emphasis voltage in a case of making a transition from the first voltage state to the third voltage state.

3. The communication system according to claim 2, wherein the driver section includes:
a first driver section that selectively sets a voltage state at a first output terminal to any of the first voltage state, the second voltage state, and the third voltage state;
a second driver section that selectively sets a voltage state at a second output terminal to any of the first voltage state, the second voltage state, and the third voltage state; and
a third driver section that selectively sets a voltage state at a third output terminal to any of the first voltage state, the second voltage state, and the third voltage state, and
wherein the voltage states at the first output terminal, the second output terminal, and the third output terminal differ from one another.

4. The communication system according to claim 3, wherein
the data signal indicates a sequence of a symbol, and
the control section sets, in accordance with the sequence of the symbol, the emphasis voltage at each of the first output terminal, the second output terminal, and the third output terminal.

5. The communication system according to claim 4, further comprising:
a signal generation section that generates, on a basis of a transition signal indicating symbol transition, a first symbol signal indicating a symbol, and a second symbol signal indicating a symbol that is earlier by one symbol than the symbol indicated by the first symbol signal,
wherein the control section sets, on a basis of the first symbol signal and the second symbol signal, the emphasis voltage at each of the first output terminal, the second output terminal, and the third output terminal.

6. The communication system according to claim 5, wherein the first driver section, the second driver section, and the third driver section respectively set, on a basis of the first symbol signal, the voltage states at the first output terminal, the second output terminal, and the third output terminal.

7. The communication system according to claim 4, further comprising a signal generation section that generates, on a basis of a transition signal indicating symbol transition, a symbol signal indicating a symbol,
wherein the control section sets, on a basis of a sequence of the symbol indicated by the symbol signal, the emphasis voltage at each of the first output terminal, the second output terminal, and the third output terminal.

8. The communication system according to claim 3, wherein
the first driver section includes:
a first circuit that is provided on a path from a first power supply to the first output terminal; and
a second circuit that is provided on a path from a second power supply to the first output terminal, and
the control section sets an impedance ratio of an impedance of the first circuit to an impedance of the second circuit, and thereby sets the emphasis voltage at the first output terminal.

9. The communication system according to claim 8, wherein the control section sets the impedance ratio to cause a parallel impedance of the impedance of the first circuit and the impedance of the second circuit to be constant.

10. The communication system according to claim 8, wherein
the first circuit includes a plurality of first sub-circuits each including a first resistor and a first transistor that are provided on the path from the first power supply to the first output terminal,
the second circuit includes a plurality of second sub-circuits each including a second resistor and a second transistor that are provided on the path from the second power supply to the first output terminal, and
the control section sets a number of first transistors to be turned ON out of the first transistors that are provided in the first circuit, and sets a number of second transistors to be turned ON out of the second transistors that are provided in the second circuit, and thereby sets the emphasis voltage at the first output terminal.

11. The communication system according to claim 10, wherein
the plurality of first sub-circuits are grouped into a plurality of first groups,
the plurality of second sub-circuits are grouped into a plurality of second groups, and
the control section causes the first transistors in the first circuit to turn ON and OFF in a unit of one of the plurality of first groups, and causes the second transistors in the second circuit to turn ON and OFF in a unit of one of the plurality of second groups, and thereby sets the emphasis voltage at the first output terminal.

12. The communication system according to claim 11, wherein
the plurality of first groups include a first sub-group and a second sub-group, and
a first number of the plurality of first sub-circuits that belong to the first sub-group differs from a second number of the plurality of first sub-circuits that belong to the second sub-group.

13. The communication system according to claim 1, wherein the voltages in each of the voltage states are able to be set to have same number of voltages as the predetermined number, the voltages differing from one another.

14. The communication system according to claim 1, wherein the emphasis comprises de-emphasis.

15. The communication system according to claim 1, wherein the emphasis comprises pre-emphasis.

16. The communication system according to claim 1, wherein the transmission device is one selected from a group consisting of:
a MIPI interface,
a vehicle state detecting section,
a driving system control circuitry,
a battery,
a battery control circuitry,
an imaging section,
an outside-vehicle information detecting section,
an outside-vehicle information detecting circuitry,
a driver state detecting section, and
an in-vehicle information detecting circuitry.

17. The communication system according to claim 1, wherein the reception device is one selected from a group consisting of:
a driving system control circuitry,
a battery control circuitry,
an outside-vehicle information detecting circuitry, and
an in-vehicle information detecting circuitry.

18. The communication system according to claim 1, wherein the communication network is one selected from a group consisting of:
a controller area network,
a local interconnect network, and
a FlexRay® network.

19. The communication system according to claim 1, wherein the communication network is part of a serializer and a deserializer (SERDES) network between an electronic control unit and an imaging section.

20. A communication method comprising:
transmitting, with a transmission device, a data signal by using three or more predetermined number of voltage states;
setting, with the transmission device, an emphasis voltage that is based on a transition among the predetermined number of the voltage states, and thereby performing emphasis;
receiving, with a reception device, the data signal and the emphasis voltage from the transmission device; and
communicating, with the reception device, information to a control device via a communication network, the information based on the data signal and the emphasis voltage.

* * * * *